US010615235B2

(12) United States Patent
Heo

(10) Patent No.: US 10,615,235 B2
(45) Date of Patent: Apr. 7, 2020

(54) THIN FILM TRANSISTOR ARRAY SUBSTRATE AND ORGANIC LIGHT EMITTING DISPLAY DEVICE HAVING SAME

(71) Applicant: LG DISPLAY CO., LTD., Seoul (KR)

(72) Inventor: Jinhee Heo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/170,925

(22) Filed: Oct. 25, 2018

(65) Prior Publication Data

US 2019/0131370 A1 May 2, 2019

(30) Foreign Application Priority Data

Oct. 26, 2017 (KR) .................. 10-2017-0140194

(51) Int. Cl.
*H01L 27/32* (2006.01)
*G09G 3/3225* (2016.01)
(Continued)

(52) U.S. Cl.
CPC ....... *H01L 27/3262* (2013.01); *G09G 3/3225* (2013.01); *G09G 3/3233* (2013.01); *G09G 3/3266* (2013.01); *G09G 3/3275* (2013.01); *H01L 27/3265* (2013.01); *H01L 27/3276* (2013.01); *G09G 2300/0842* (2013.01); *G09G 2310/0262* (2013.01); *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01)

(58) Field of Classification Search
CPC ............. H01L 27/3262; H01L 27/3265; H01L 27/3276; H01L 27/1225; H01L 27/124; H01L 27/1251; H01L 27/1255; H01L 29/78675; H01L 29/7869; G09G 3/3225; G09G 3/3233; G09G 3/3266; G09G 3/3275; G09G 2300/0842; G09G 2310/0262

USPC ......................................................... 257/40
See application file for complete search history.

(56) References Cited

U.S. PATENT DOCUMENTS

| 7,986,095 | B2 | 7/2011 | Rhee et al. |
| 8,704,267 | B2 | 4/2014 | Godo |
| 2017/0338252 | A1* | 11/2017 | Lee ............... H01L 27/1255 |

FOREIGN PATENT DOCUMENTS

CN 105304673 A 2/2016

* cited by examiner

*Primary Examiner* — Tu-Tu V Ho
(74) *Attorney, Agent, or Firm* — Birch, Stewart, Kolasch & Birch, LLP

(57) ABSTRACT

An embodiment of the present invention provides a thin film transistor array substrate having a first thin film transistor, a second thin film transistor and a capacitor connected with a gate electrode of the first thin film transistor, and a third thin film transistor connected with the capacitor, wherein the thin film transistor array substrate comprises a first capacitor electrode disposed on a first gate insulation film covering an active layer of the third thin film transistor; an active layer of the second thin film transistor disposed on a second gate insulation film covering the first capacitor electrode; a gate electrode of the second thin film transistor disposed on an intermediate insulation film covering a portion of active layer of the second thin film transistor; and a second capacitor electrode of the capacitor disposed on the intermediate insulation film and overlapped with the first capacitor electrode.

15 Claims, 20 Drawing Sheets

(51) Int. Cl.
*G09G 3/3266* (2016.01)
*G09G 3/3275* (2016.01)
*G09G 3/3233* (2016.01)
*H01L 29/786* (2006.01)
*H01L 27/12* (2006.01)

THIN FILM TRANSISTOR ARRAY SUBSTRATE AND ORGANIC LIGHT EMITTING DISPLAY DEVICE HAVING SAME

CROSS-REFERENCE TO RELATED APPLICATION

This application claims the priority benefit of the Korean Patent Application No. 10-2017-0140194, filed on Oct. 26, 2017 in the Korean Intellectual Property Office, the disclosure of which is incorporated herein in its entirety by reference.

BACKGROUND OF THE INVENTION

1. Field of the Invention

The present invention relates to a thin film transistor array substrate having at least two thin film transistors and a capacitor connected with at least one of the transistors, and an organic light emitting display device having the same.

2. Description of the Related Art

Display devices are applied in various electronic devices such as a television (TV), a portable phone, a laptop computer, a tablet, etc. So, much effort has been made in order to reduce the thickness, weight, and power consumption of the display device.

Representative examples of the display device include a liquid crystal display device (LCD), a plasma display device (PDP), a field emission Display device (FED), an electro-luminescence Display device (ELD), an electro-Wetting Display device (EWD), and an organic light emitting display device (OLED), etc.

Generally, these display devices include a polarizing material or a light emitting material disposed between a pair of the substrates. Here, one of the pair of the substrates can be a thin film transistor array substrate which defines a plurality of pixel areas corresponding to a plurality of pixels in a display area where an image is displayed, and drives the respective pixels.

For example, as for the organic light emitting display device, the thin film transistor array substrate can include a driving thin film transistor which supplies a drive current to the organic light emitting device in the respective pixel areas, a switching thin film transistor which supplies a data signal corresponding to the brightness of the organic light emitting device, and a capacitor which is charged by the data signal. Also, the thin film transistor array substrate of the organic light emitting display device can further include a sampling thin film transistor for compensating for a threshold voltage of the driving thin film transistor.

By the way, the resolution of the display device is being required to be higher in order to display clearer images, and a size of each pixel area is therefore getting smaller. More specifically, as for a 3-dimension virtual reality device (3D VR), the size of each pixel area can be decreased even to one twentieth the size of a normal display device.

As the size of each pixel area gets smaller, the areas allocated for the thin film transistors and capacitors corresponding to each of the pixel areas are also decreased, which could result in the degradation of device characteristics.

For example, as for the sampling thin film transistor, the length of an active layer can be decreased and, as a result, a leakage current greater than a threshold can occur more frequently. This leakage current of the sampling thin film transistor can cause malfunction of the organic light emitting device as well as a blur and an abnormal brightness. So, the display quality can be degraded.

Further, as for the capacitor, the capacitance of the capacitor is decreased due to the reduced size of the capacitor. Therefore, the drive current cannot be supplied to the driving thin film transistor stably during respective frames. This unstable supply of the drive current can result in a decrease in the brightness of the organic light emitting diode and can cause the display quality to be degraded.

SUMMARY OF THE INVENTION

An objective of the present invention is to provide a thin film transistor array substrate, which is capable of preventing characteristics of elements corresponding to the respective pixel areas from being degraded due to the decreased size of the elements, and to provide an organic light emitting display device having the same.

The objectives of the present invention are not limited to the objective mentioned in the above, and other objectives and advantages of the present invention can be understood based on the description in the following and more clearly understood based on the embodiments of the present invention. In addition, it will be apparent that the objectives and advantages of the present invention can be realized by the means set forth in the claims and a combination thereof.

An embodiment of the present invention provides a thin film transistor array substrate having a first thin film transistor, a second thin film transistor and a capacitor connected with a gate electrode of the first thin film transistor, and a third thin film transistor connected with the capacitor, wherein the thin film transistor array substrate comprises: a first capacitor electrode disposed on a first gate insulation film covering an active layer of the third thin film transistor; an active layer of the second thin film transistor disposed on a second gate insulation film covering the first capacitor electrode; a gate electrode of the second thin film transistor disposed on an intermediate insulation film covering a portion of the active layer of the second thin film transistor; and a second capacitor electrode of the capacitor disposed on the intermediate insulation film and overlapped with the first capacitor electrode.

The thin film transistor array substrate can further comprise a gate electrode of the third thin film transistor disposed on the first gate insulation film and overlapped with a portion of the active layer of the third thin film transistor, wherein the first capacitor electrode is spaced apart from the gate electrode of the third thin film transistor.

The thin film transistor array substrate can further comprise a capacitor hole which corresponds to a portion of an area where the first and second capacitor electrodes overlap with each other and penetrates the second gate insulation film.

The active layer of the third thin film transistor can be made of a polysilicon semiconductor material, and the active layer of the second thin film transistor can be made of an oxide semiconductor material.

Another embodiment of the present invention provides an organic light emitting display device having organic light emitting devices corresponding to respective pixel areas, a first thin film transistor supplying a drive current to the organic light emitting devices, a capacitor and a second thin film transistor connected with a gate electrode of the first thin film transistor, and a third thin film transistor connected with the capacitor, comprising: an active layer of the third thin film transistor disposed on a substrate; a first gate insulation film which covers the active layer of the third thin film transistor; a gate electrode of the third thin film transistor disposed the first gate insulation film and overlapping with a portion of the active layer of the third thin film transistor; a first capacitor electrode of the capacitor disposed on the first gate insulation film and is spaced apart from the gate electrode of the third thin film transistor; a second gate insulation film which covers the gate electrode of the third thin film transistor and the first capacitor electrode of the capacitor; an active layer of the second thin film transistor disposed on the second gate insulation film; a gate electrode of the second thin film transistor disposed on the intermediate insulation film which covering a portion of the active layer of the second thin film transistor; and a second capacitor electrode of the capacitor disposed on the intermediate insulation film and overlapped with the first capacitor electrode.

The organic light emitting display device can further comprise a capacitor hole which corresponds to a portion of an area where the first and second capacitor electrodes overlap with each other and penetrates the second gate insulation film.

The active layer of the first thin film transistor can be disposed on the same layer as the active layer of the third thin film transistor, and the gate electrode of the first thin film transistor can be disposed on the first gate insulation film and connected with the first capacitor electrode.

In this case, one of a source electrode and a drain electrode of the first thin film transistor can be connected with a first source line while the other one is connected with the organic light emitting device, one of a source electrode and a drain electrode of the second thin film transistor can be connected with a first node between the capacitor and the gate electrode of the first thin film transistor while the other one is connected with a second node between the first thin film transistor and the organic light emitting device, one of a source electrode and a drain electrode of the third thin film transistor can be connected with a data line while the other one is connected with the second capacitor electrode of the capacitor, and an anode electrode of the organic light emitting device can be connected with the second node while a cathode electrode of the organic light emitting device is connected with a second source line.

Alternatively, the active layer of the first thin film transistor can be disposed on the second gate insulation film, and the gate electrode of the first thin film transistor can be disposed on the intermediate insulation film covering a portion of the active layer of the first thin film transistor and can be connected with the second capacitor electrode.

In this case, one of a source electrode and a drain electrode of the first thin film transistor can be connected with a first source line while the other one is connected with the organic light emitting device, wherein the first capacitor electrode of the capacitor is connected with a first node between the gate electrode of the first thin film transistor and the third thin film transistor, while the second capacitor electrode of the capacitor is connected with a second node between the first thin film transistor and the organic light emitting device, wherein one of one of a source electrode and a drain electrode of the second thin film transistor can be connected with the first node while the other one is connected with a third node between the first source line and the first thin film transistor, wherein one of a source electrode and a drain electrode of the third thin film transistor can be connected with a data line while the other one is connected with the first node, and an anode electrode of the organic light emitting device can be connected with the second node while a cathode electrode of the organic light emitting device is connected with a second source line.

The active layer of the third thin film transistor can be made of a polysilicon semiconductor material, and the active layer of the second thin film transistor can be made of an oxide semiconductor material.

According to embodiments of the present invention, the thin film transistor array substrate having first, second and, third thin film transistors corresponding to the respective pixels and a capacitor, comprises a gate electrode and of the third thin film transistor and first capacitor electrode which are disposed on the first gas insulation film covering an active layer of the third thin film transistor, an active layer of the second thin film transistor disposed on the second gate insulation film covering the first capacitor electrode, a gate electrode of the second thin film transistor disposed on an intermediate insulation film covering a portion of the active layer of the second thin film transistor, and a second capacitor electrode which overlaps with the first capacitor electrode and is disposed on the intermediate insulation film. In this manner, the capacitor can be implemented by the first capacitor electrode disposed on the same layer as the gate electrode of the third thin film transistor and the second capacitor electrode disposed on the same layer as the gate electrode of the second thin film transistor. That is, no separate conductive layer is required to implement the capacitor, which simplifies the structure of the thin film transistor array substrate.

In addition, according to embodiments of the present invention, the thin film transistor array substrate further comprises a capacitor hole which corresponds to a portion of an area where the first and second capacitor electrodes overlap with each other and penetrates the second gate insulation film. This capacitor hole can increase the capacitance of the capacitor corresponding to an overlapped area between the first and second capacitor electrodes. Therefore, the size of the pixel area is decreased, which minimizes the reduction of the capacitance of the capacitor even when the area allocated for the capacitor is decreased. As a result, a high resolution organic light emitting display device can be easily manufactured.

According to embodiments of the present invention, the second thin film transistor, which compensates for the threshold voltage of the first thin film transistor supplying a drive current to the organic light emitting device, has an active layer made of an oxide semiconductor material. Therefore, malfunction of the organic light emitting device due to the leakage current of the second thin film transistor can be minimized, thereby preventing the brightness of the organic light emitting display device from being degraded.

DETAILED DESCRIPTION OF THE EMBODIMENTS

The objectives, features, and advantages will be explained in detail by referring to the appended figures, such that a skilled person in the art to which the present invention pertains can readily practice the technical spirit of the present invention. Also, in the explanation on the present invention in the following, detailed explanations on related known technique will be omitted when it is determined that they will unnecessarily obscure the subject matter of the present invention. In the following, preferred embodiments of the present invention will be described in detail by referring to appended figures. In the figures, same reference symbols are used to refer to the same or similar components.

In the following, the thin film transistor array substrate and the organic light emitting display device having the same according to embodiments of the present invention will be explained in detail by referring to the appended figures.

At first, by referring to FIG. 1, the organic light emitting display device according to an embodiment of the present invention will be explained.

Figure 1:
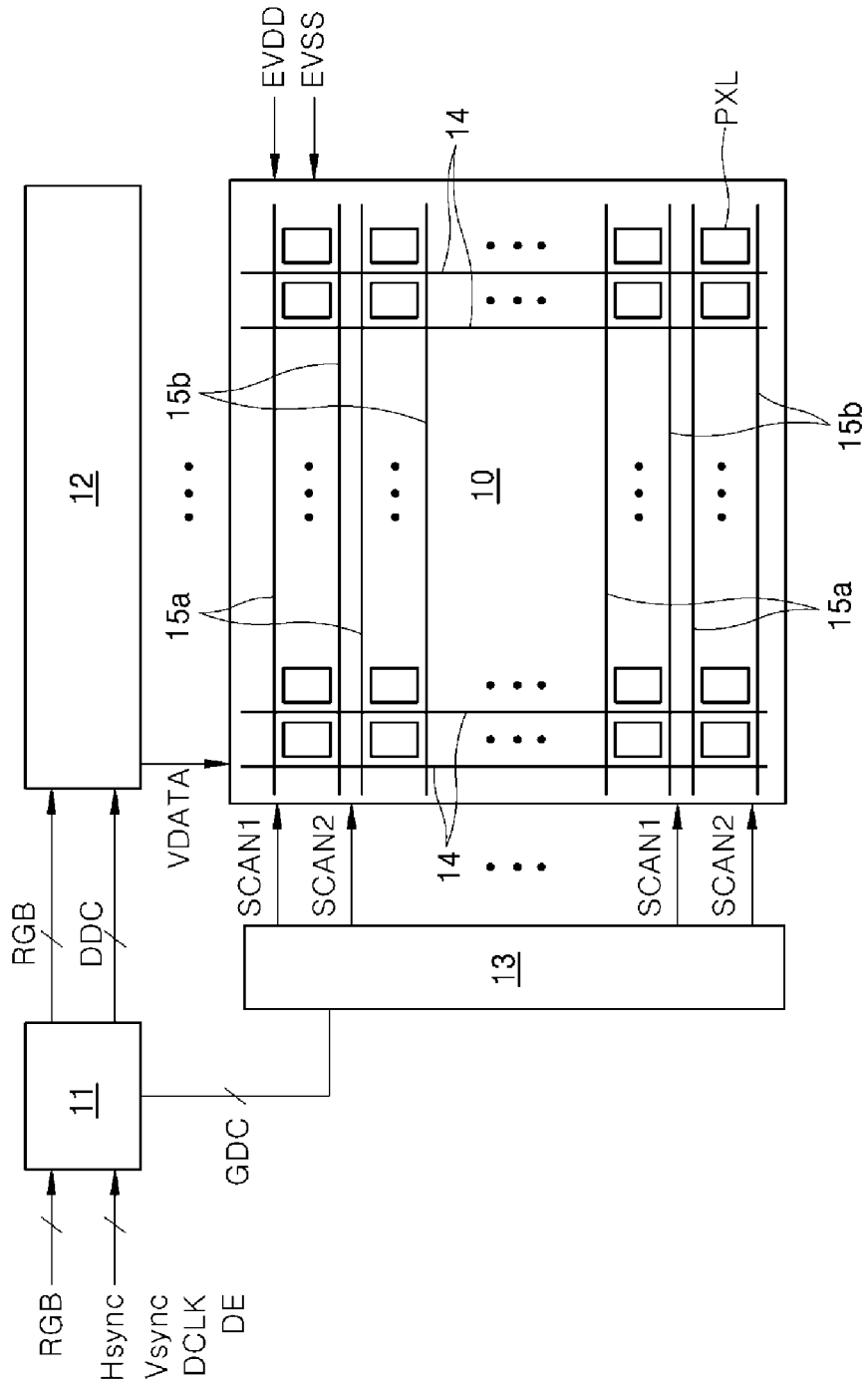
FIG. 1 is a diagram illustrating an organic light emitting display device according to an embodiment of the present invention.

FIG. 1 is a diagram illustrating an organic light emitting display device according to an embodiment of the present invention. All the components of the organic light emitting display devices and the thin film transistor array substrates according to all embodiments of the present invention are operatively coupled and configured.

As shown in FIG. 1, the organic light emitting display device according to the embodiment of the present invention includes a display panel 10 having a plurality of pixels PXL, a data driving circuit 12 for driving a plurality of data lines 14 of the display panel 10, a gate driving circuit 13 for driving a plurality of first and second scan lines 15a, 15b of the display panel 10, and a timing controller 11 for controlling drive timings of the data driving circuit 12 and gate driving circuit 13.

The display panel 10 includes a pair of the substrates which face and bond with each other, and a thin film transistor array and an organic light emitting device array which are disposed between the pair of the substrates. For example, one of the pair of the substrates can be a thin film transistor array on which a thin film transistor array is disposed. And, the other of the pair of the substrates can be an encapsulation substrate which encapsulates the organic light emitting device array disposed on the thin film transistor array.

The thin film transistor array substrate of the display panel 10 includes a substrate, the first and second scan lines 15a, 15b disposed to extend in a first direction (left-right direction in FIG. 1) on the substrate, and the data lines 14 disposed to extend in a second direction (up-down direction in FIG. 1). In the meantime, the pixel areas corresponding to the plurality of pixels PXL can be defined as an intersection area between one of the first and second scan lines 15a, 15b and the data line 14. These pixel areas are disposed in a matrix formation in a display area where an image is actually displayed.

The thin film transistor array substrate of the display panel 10 includes a first source line for supplying a first driving source EVDD to the plurality of pixels PXL, and a second source line for supplying a second driving source EVSS which is lower than the first driving source EVDD.

The timing controller 11 rearranges the digital video data RGB received from outside according to a resolution of the display panel 10, and supplies the rearranged digital video data RGB' to the data driving circuit 12.

The timing controller 11 supplies a data control signal DDC for controlling the operation timing of the data driving circuit 12 and a gate control signal GDC for controlling the operation timing of the gate driving circuit 13 based on various timing signals such as a vertical synchronous signal Vsync, a horizontal synchronous signal Hsync, a dot clock signal DCLK, a data enable signal DE, etc.

The data driving circuit 12 converts the rearranged digital video data RGB' to an analog data voltage based on the data control signal DDC. Further, the data driving circuit 12 supplies a data signal VDATA to the pixels of the respective horizontal lines during respective horizontal periods based on the rearranged digital video data RGB'.

The gate driving circuit 13 can generate first and second scan signals SCAN1, SCAN2 based on the gate control signal GDC. The gate driving circuit 13 can supply the first and second scan signals SCAN1, SCAN2 sequentially to the plurality of horizontal lines. In the meantime, during each horizontal period, the gate driving circuit 13 supplies the first scan signal SCAN1 to the first scan line 15a and supplies the second scan signal SCAN2 to the second scan line 15b.

This gate driving circuit 13 can be disposed in a non-display area of the display panel 10 according to a gate-driver in panel (GIP) method.

Next, a thin film transistor array substrate according to the first embodiment of the present invention will be explained in more detail by referring to FIGS. 2-5.

Figure 2:
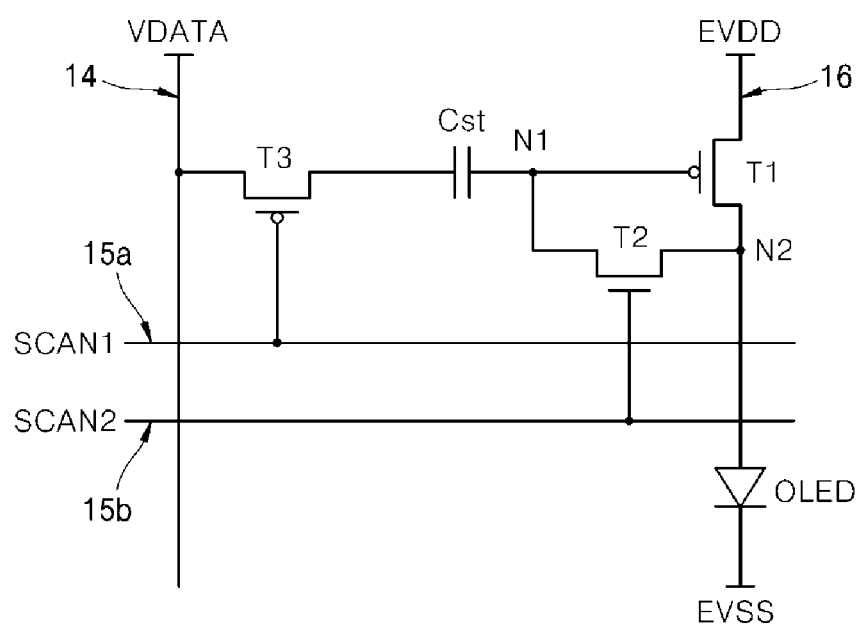
FIG. 2 is a diagram showing an equivalent circuit corresponding to one pixel in the organic light emitting display device according to the first embodiment of the present invention.
Figure 3:
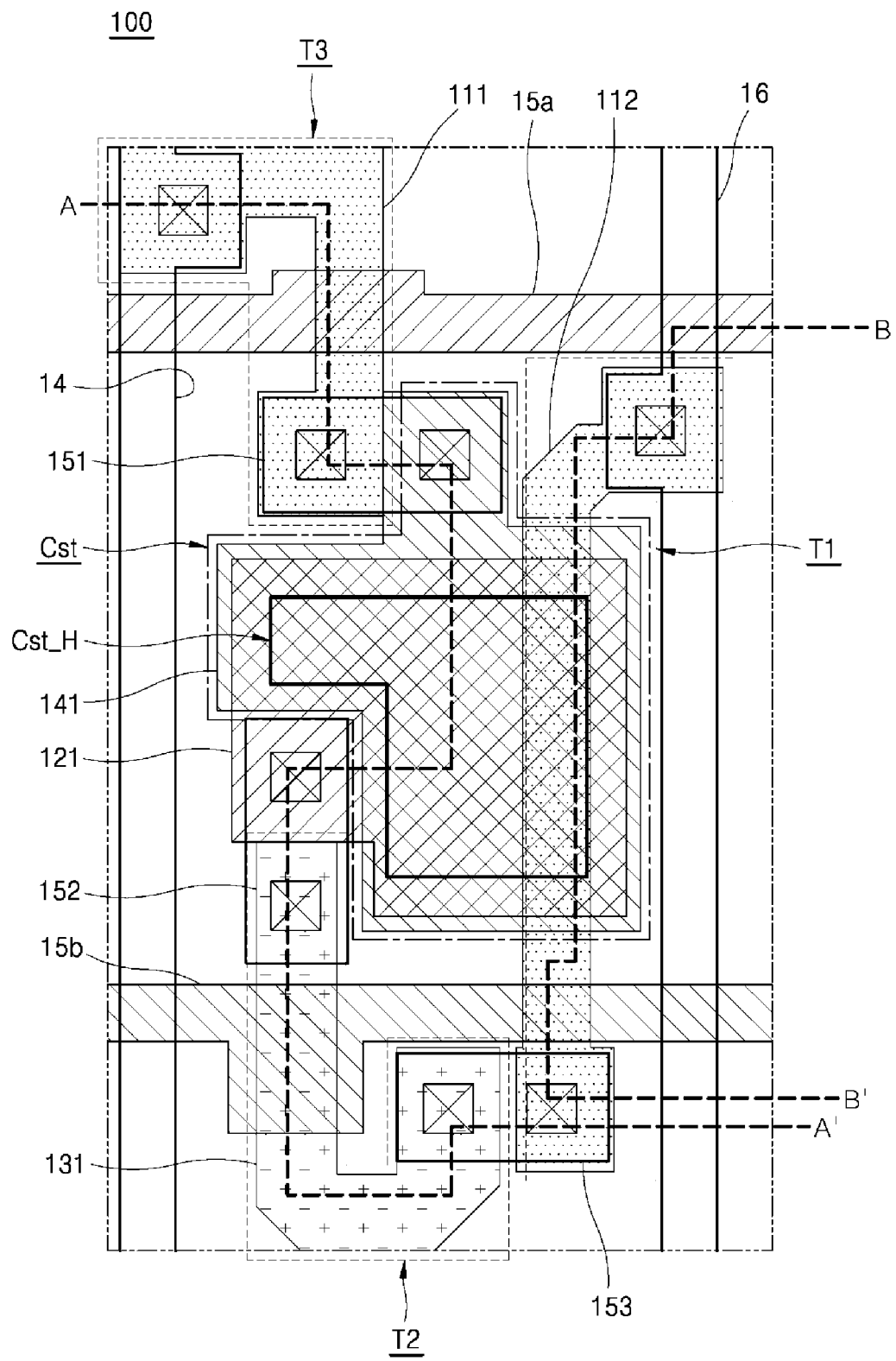
FIG. 3 is a diagram shown an example of the thin film transistor array substrate of FIG. 2 having first, second, and third thin film transistors and a capacitor.
Figure 4:
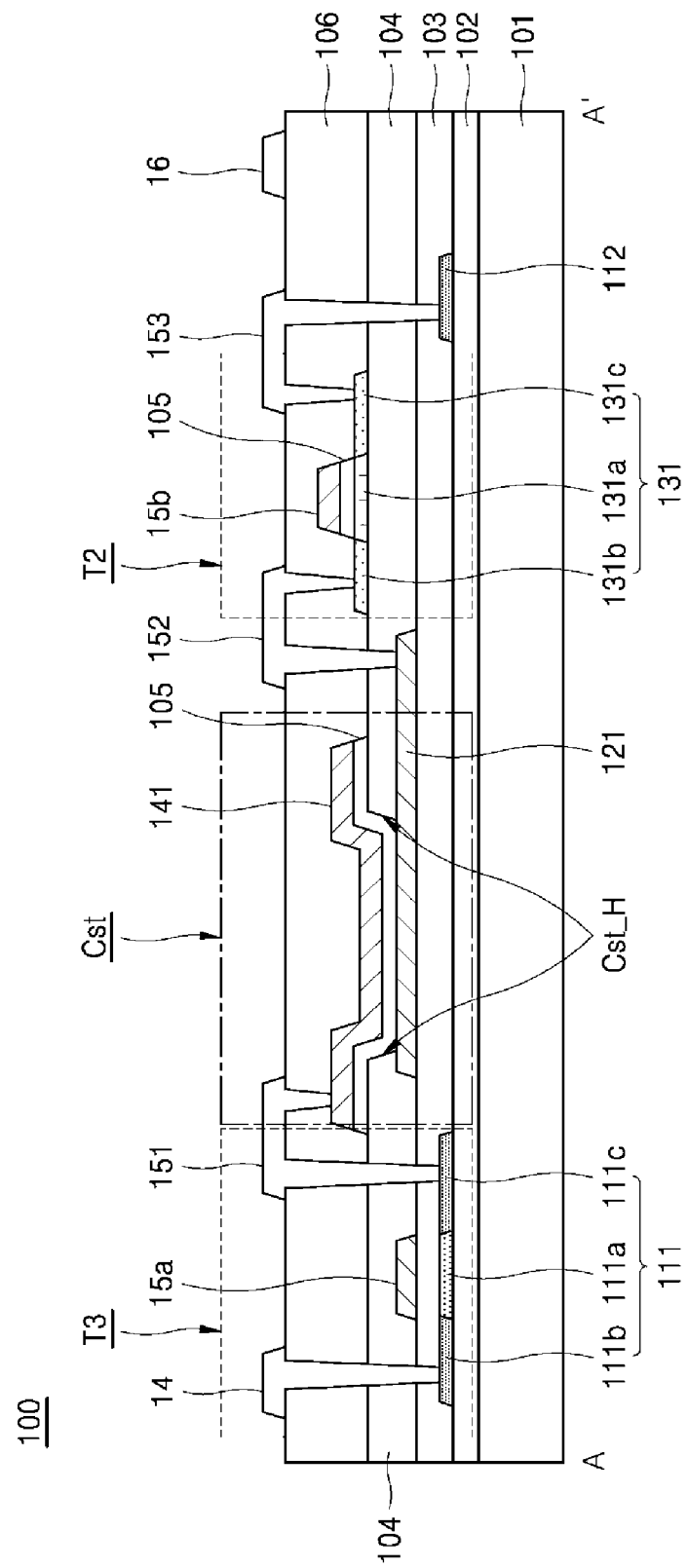
FIG. 4 is a cross-sectional view taken along a line A-A' of FIG. 3.
Figure 5:
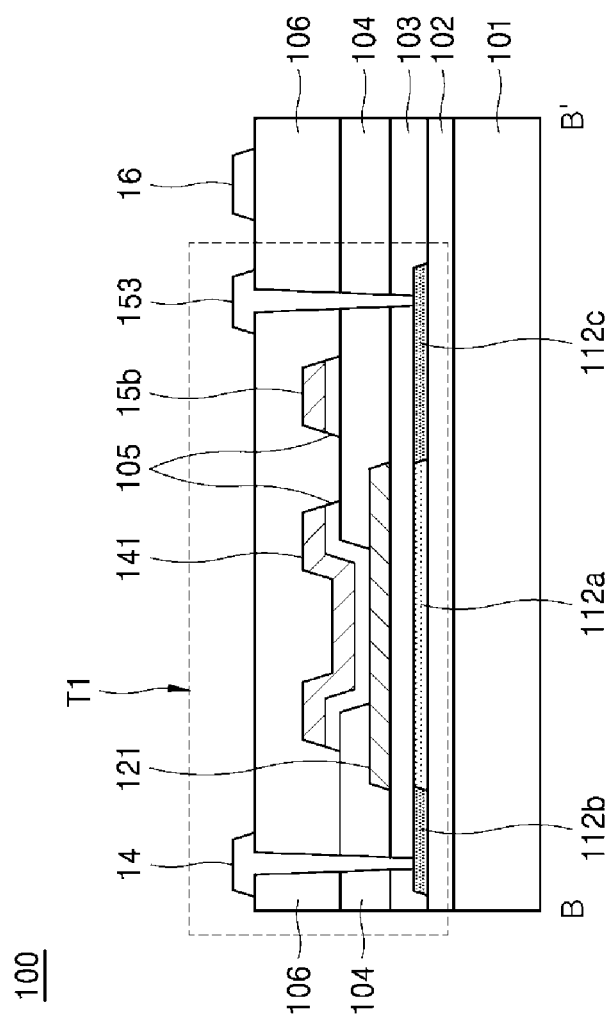
FIG. 5 is a cross-sectional view taken along a line B-B' of FIG. 3.

FIG. 2 is a diagram showing an equivalent circuit corresponding to one pixel in the organic light emitting display device according to the first embodiment of the present invention. FIG. 3 is a diagram shown an example of the thin film transistor array substrate of FIG. 2 having first, second, and third thin film transistors and a capacitor. FIG. 4 is a cross-sectional view taken along a line A-A' of FIG. 3. FIG. 5 is a cross-sectional view taken along a line B-B' of FIG. 3.

As shown in FIG. 2, in the organic light emitting display device according to the first embodiment of the present invention, each of the pixels PXL includes an organic light emitting device OLED, a first thin film transistor T1 for supplying a drive current to the organic light emitting device OLED, a capacitor Cst and a second thin film transistor T2 which are connected with a gate electrode of the first thin film transistor T1, and a third thin film transistor T3 which is connected with the capacitor Cst.

The first thin film transistor T1 is connected in series with the organic light emitting device OLED between a first source line supplying a first driving source EVDD and a second source line supplying a second driving source EVSS.

For example, one of a source electrode and a drain electrode of the first thin film transistor T1 is connected with the first source line supplying the first driving source EVDD while the other one is connected with an anode electrode of the organic light emitting device OLED. And, a cathode electrode of the organic light emitting device OLED is connected with a second source line supplying a second driving source EVSS.

The capacitor Cst is connected between the gate electrode of the first thin film transistor T1 and the third thin film transistor. The capacitor Cst is charged by the data voltage VDATA which is supplied through the turned-on third thin film transistor T2.

The second thin film transistor T2 is provided to compensate for the threshold voltage of the first thin film transistor T1. That is, the second thin film transistor T2 is provided to prevent the drive current supplied to the organic light emitting device OLED from being affected by the threshold voltage of the first thin film transistor T1.

The second thin film transistor T2 can be connected between one of the source electrode and the drain electrode of the first thin film transistor T1, which is connected with the organic light emitting device OLED, and the gate electrode of the first thin film transistor T1. And, the gate electrode of the second thin film transistor T2 is connected with the second scan line 15b supplying the second scan signal SCAN2.

For example, one of the source electrode and the drain electrode of the second thin film transistor T2 is connected with a first node N1 between the gate electrode of the first thin film transistor T1 and the capacitor Cst, while the other one is connected with a second node N2 between the first thin film transistor T1 and the organic light emitting device OLED. When the second thin film transistor T2 is turned on based on the second scan signal SCAN2, it connects the first node N1 with the second node N2.

The third thin film transistor T3 is provided to supply the data signal for driving the first thin film transistor T1 to the capacitor Cst and to the gate electrode of the first thin film transistor T1 connected with the capacitor Cst.

The third thin film transistor T3 is connected between the data line 14 supplying the data signal VDATA and the capacitor Cst. For example, one of the source electrode and the drain electrode of the third thin film transistor T3 is connected with the data line 14 supplying the data signal VDATA, while the other one is connected with the capacitor Cst. And, the gate electrode of the third thin film transistor T3 is connected with the first scan line 15a supplying the first scan signal SCAN1. When the third thin film transistor T3 is turned on based on the first scan signal SCAN1, it provides the data signal VDATA to the capacitor Cst.

In the thin film transistor array substrate having the first, second and third thin film transistors T1, T2, T3 as described above, the size for respective pixel areas can be decreased, which results in high resolution of the organic light emitting display device. In this case, as the area allocated for respective thin film transistors is reduced, some characteristics of the thin film transistor may be degraded. For example, a leakage current may be increased.

As a further example, the leakage current may be generated in the second thin film transistor T2, which causes the first thin film transistor T1 to be turned on and incurs malfunction of the organic light emitting device OLED.

In order to prevent this, the second thin film transistor T2 can include an active layer made of an oxide semiconductor material which has a better leakage current suppression property than a low-temperature polycrystalline silicon semiconductor (LTPS) material.

On the other hand, the third thin film transistor T3 can include an active layer made of the low-temperature polycrystalline silicon semiconductor (LTPS) material in order to accelerate a response time to ON-OFF switching.

According to the first embodiment, as in the case for the third thin film transistor T3, the first thin film transistor T1 can include an active layer made of the LTPS.

In this case, in order to simplify processes, the first and third thin film transistors T1, T3 including active layers made of the LTPS can be implemented as PMOS transistors, while the second thin film transistor T2 including the active layer made of the oxide semiconductor material can be implemented as an NMOS transistor.

As shown in FIG. 3, a thin film transistor array substrate 100 according to the first embodiment of the present invention includes first, second and third thin film transistors T1, T2, T3 and a capacitor Cst disposed in the respective pixel areas.

The thin film transistor array substrate 100 can further include first and second scan lines 15a, 15b in a first direction (left-right direction in FIG. 3), and a data line 14 and a first source line 16 in a second direction (up-down direction in FIG. 3).

The thin film transistor array substrate 100 can further include a first connecting pattern 151 for connecting the third thin film transistor T3 with the capacitor Cst, a second connecting pattern 152 for connecting the second thin film transistor T2 with the capacitor Cst, and a third connecting pattern 153 for connecting the first thin film transistor T1 with the second thin film transistor T2.

Both ends of the active layer 112 of the first thin film transistor T1 are connected with the first source line 16 and the second thin film transistor T2, respectively.

Both ends of the active layer 131 of the second thin film transistor T2 are connected with the first thin film transistor T1 and the capacitor Cst, respectively. The gate electrode of the second thin film transistor T2 is made by a portion of the second scan line 15b which overlaps with a portion of the active layer 131 of the second thin film transistor T2.

Both ends of the active layer 111 of the third thin film transistor T3 are connected with the data line 14 and the capacitor Cst, respectively. The gate electrode of the third thin film transistor T3 is made by a portion of the first scan line 15a which overlaps with a portion of the active layer 111 of the third thin film transistor T3.

The capacitor Cst includes first and second capacitor electrodes 121, 141 which overlap with each other.

The first capacitor electrode 121 is connected with the second thin film transistor T2 through the second connecting pattern 152. And, a portion of the first capacitor electrode 121, which overlaps with a portion of the active layer 112 of the first thin film transistor T1, serves as the gate electrode of the first thin film transistor T1. Therefore, the second connecting pattern 152, with which gate electrode of the first thin film transistor T1, the first capacitor electrode 121, and the second thin film transistor T2 are connected, corresponds to the first node N1 in FIG. 2.

The second capacitor electrode 141 is connected with the third thin film transistor T3 via the first connecting pattern 151.

A capacitor hole Cst_H is disposed in a portion of an area where the first and second capacitor electrodes 121, 141 overlap with each other.

As shown in FIG. 4, the thin film transistor array substrate 100 includes a buffer film 102 covering a surface of a substrate 101, an active layer 111 of a third thin film transistor T3 disposed on the buffer film 102, a first gate insulation film 103 covering the active layer 111 of the third thin film transistor T3, a gate electrode 15a of the third thin film transistor T3 disposed on the first gate insulation film 103, a first capacitor electrode 121 of a capacitor Cst disposed on the first gate insulation film 103 and spaced apart from the gate electrode 15a of the third thin film transistor T3, a second gate insulation film 104 covering a gate electrode 15a of the third thin film transistor T3 and the first capacitor electrode 121 of the capacitor Cst, a capacitor hole Cst_H which corresponds to a portion of the first capacitor electrode 121 and penetrates the second gate insulation film 104, an active layer 131 of a second thin film transistor T2 disposed on the second gate insulation film 104, a gate electrode 15b of the second thin film transistor T2 disposed on the intermediate insulation film 105 covering a portion of the active layer 131 of the second gate insulation film 104, a second capacitor electrode 142 of the capacitor Cst disposed on the intermediate insulation film 105 and overlapped with the first capacitor electrode 121, an interlayer insulation film 106 covering the active layer 131 and the gate electrode 15b of the second thin film transistor T2 and the second capacitor electrode 142 of the capacitor Cst, a data line 14 and a first source line 16 disposed on the interlayer insulation film 106, and first, second and third connecting patterns 151, 152, 153.

In other words, the third thin film transistor T3 includes an active layer 111 disposed on the substrate 101 or the buffer film 102, and a gate electrode 15a disposed on the first gate insulation film 103 and made by a portion of the first scan line 15a which overlaps with a portion of the active layer 111.

Here, the active layer 111 disposed on the substrate 101 or the buffer film 102 can be made of a low-temperature polycrystalline (LTPS) material. And, the active layer 111 includes a channel area 111a, which overlaps with the gate electrode 15a, as well as a source area 111b and a drain area 111c which are disposed at both sides of the channel area 111a. The source electrode and the drain electrode of the third thin film transistor T3 corresponds to the source area 111b and the drain area 111c of the active layer 111, respectively. For example, the source area 111b and the drain area 111c of the active layer 111 can be an area which is doped by dopants to a concentration higher than that of the channel area 111a.

One of the source electrode 111b and the drain electrode 111c of the third thin film transistor T3 (e.g., source electrode 111b in FIG. 4) can be connected with the data line 14 disposed on the interlayer insulation film 106, while the other one (e.g., drain electrode 111c in FIG. 4) can be connected with the first capacitor electrode 121 of the capacitor Cst through the first connecting pattern 151 disposed on the interlayer insulation film 106.

The capacitor Cst is disposed on the first gate insulation film 102 and includes a first capacitor electrode 121 which is spaced apart from the first scan line 15a and a second capacitor electrode 141 disposed at least on the intermediate insulation film 105 and overlapped with the first capacitor electrode 121. The capacitor Cst according to the first embodiment of the present invention includes a capacitor hole Cst_H which corresponds to a portion of the overlapped area between the first and second capacitor electrodes 121, 141 and penetrates the second gate insulation film 104.

A portion of the first capacitor electrode 121 serves as the gate electrode of the first thin film transistor T1, and the second capacitor electrode 122 is connected with third thin film transistor T3 through the first connecting pattern 151 disposed on the interlayer insulation film 106.

The intermediate insulation film 105 under the second capacitor electrode 122 is disposed on the second gate insulation film 104. Therefore, a portion of the second capacitor electrode 104 which corresponds to the capacitor hole Cst_H overlaps only with the intermediate insulation film 105 while the rest overlaps with the second gate insulation film 104 and the intermediate insulation film 105. That is, a portion of the intermediate insulation film 105 disposed under the second capacitor electrode 141 which corresponds to the capacitor hole Cst_H comes into contact with the first and second capacitor electrodes 121, 141.

Similarly, only the intermediate insulation film 105 is disposed in a portion of the overlapped area between the first and second capacitor electrodes 121, 141 which corresponds to the capacitor hole Cst_H. In the meantime, the capacitance of the capacitor Cst generated by the first and second capacitor electrodes 121, 141 is inversely proportional to a separation distance between the first and second capacitor electrodes 121, 141. As a result, when the area where only the intermediate insulation film 105 is disposed between the first and second capacitor electrodes 121, 141 is increased by the capacitor hole Cst_H, the capacitance of the capacitor Cst can be increased even in a limited area.

The second thin film transistor T2 includes an active layer 131 disposed on the second gate insulation film 104 covering the gate electrode 15a of the third thin film transistor T3 and the first capacitor electrode 121 of the capacitor Cst, and a gate electrode 15b disposed on the intermediate insulation film 105 covering a portion of the active layer 131 and made by a portion of the second scan line 15b overlapping with the portion of the active layer 131.

Here, the active layer 131 disposed on the second gate insulation film 104 can be made of an oxide semiconductor material. The active layer 131 includes a channel area 131a, which overlaps with the gate electrode 15b, as well as a source area 131b and a drain area 131c which are disposed at both sides of the channel area 131a. The source electrode and the drain electrode of the second thin film transistor T2 corresponds to the source area 131b and the drain area 131c of the active layer 131, respectively. For example, the source area 131b and the drain area 131c of the active layer 131 can be areas which are processed to conduct more electricity than the channel area 131a.

One of the source electrode 131b and the drain electrode 131c of the second thin film transistor T2 (e.g., source electrode 131b in FIG. 4) is connected with the first capacitor electrode 121 through the second connecting pattern 152 disposed on the interlayer insulation film 106, while the other one (e.g., drain electrode 131c in FIG. 4) is connected with the active layer 112 of the first thin film transistor T1 through the third connecting pattern 153 disposed on the interlayer insulation film 106.

Further, as shown in FIG. 5, the first thin film transistor T1 includes an active layer 112 disposed on the substrate 101 or the buffer film 102, and a gate electrode 15a disposed on the first gate insulation film 103 and made by a portion of the first capacitor electrode 121 which overlaps with a portion of the active layer 112.

In the similar manner to the active layer 111 of the third thin film transistor T3, the active layer 112 of the first thin film transistor T1 can be made of an LTPS. And, the active layer 112 includes a channel area 112a, which overlaps with the gate electrode 121, as well as a source area 112b and a drain area 112c which are disposed at both sides of the channel area 112a. The source electrode and the drain electrode of the first thin film transistor T1 correspond to the source area 112b and the drain area 112c of the active layer 112, respectively. For example, the source area 112b and the drain area 112c of the active layer 112 can be an area which is doped by dopants to a concentration higher than that of the channel area 112a.

One of the source electrode 112b and the drain electrode 112c of the first thin film transistor T1 (e.g., source electrode 112b in FIG. 4) can be connected with the first source line 16 disposed on the interlayer insulation film 106, while the other one (e.g., drain electrode 112c in FIG. 4) can be connected with the second thin film transistor T2 through the through the third connecting pattern 153 disposed on the interlayer insulation film 106.

As explained in the above, according to the first embodiment of the present invention, the third thin film transistor T3 of the first, second and third thin film transistors T1, T2, T3 includes an active layer 111 disposed on the substrate 101 and a gate electrode 15a disposed on the first gate insulation film 103 covering the active layer 111, and the second thin film transistor T2 includes an active layer 131 disposed on the second gate insulation film 104 covering the gate electrode 15a of the third thin film transistor T3 and a gate electrode 121 disposed on the intermediate insulation film covering a portion of the active layer 131. And, the capacitor Cst is formed at an overlapped area between the first capacitor electrode 121 disposed on the first gate insulation film 103 and the second capacitor electrode 141 disposed on the second gate insulation film 104.

In this manner, the capacitor Cst can be implemented by the first capacitor electrode 121 disposed on the same layer as the gate electrode of the third thin film transistor T3 and the second capacitor electrode 141 disposed on the same layer as the gate electrode of the second thin film transistor T2. Therefore, the structure of the thin film transistor array substrate 100 can be simplified because the capacitor Cst can be implemented without adding a separate conductive layer.

According to the first embodiment of the present invention, the capacitor Cst includes a capacitor hole Cst_H which corresponds to a portion of the overlapped area between the first and second capacitor electrodes 121, 141. In the meantime, because of the capacitor hole Cst_H, only the intermediate insulation film 105 is disposed between the first and second capacitor electrodes 121, 141. Therefore, the capacitance of the capacitor Cst can be increased by the size of the overlapped area between the first and second capacitor electrodes 121, 141. Therefore, the size of the pixel area is decreased, which minimizes the reduction of the capacitance of the capacitor Cst even when the area allocated for the capacitor Cst is decreased. As a result, a high resolution organic light emitting display device can be easily manufactured.

Meanwhile, according to the first embodiment, in order to prevent degradation in display quality due to malfunction of the organic light emitting device OLED, the second thin film transistor T2 among the first, second, and third thin film transistors T1, T2, T3 is formed in a structure including an active layer made of the oxide semiconductor material 131.

Alternatively, as in the case for the second thin film transistor T2, the first thin film transistor T1 which supplies the drive current to the organic light emitting device OLED can also be formed in a structure including an active layer made of the oxide semiconductor material 131.

In the following, the thin film transistor array substrate according the second embodiment will be explained by referring to FIGS. 6-9. The thin film transistor array substrate according to the second embodiment includes first and second thin film transistors T1, T2 formed in a structure including an active layer made of an oxide semiconductor material.

Figure 6:
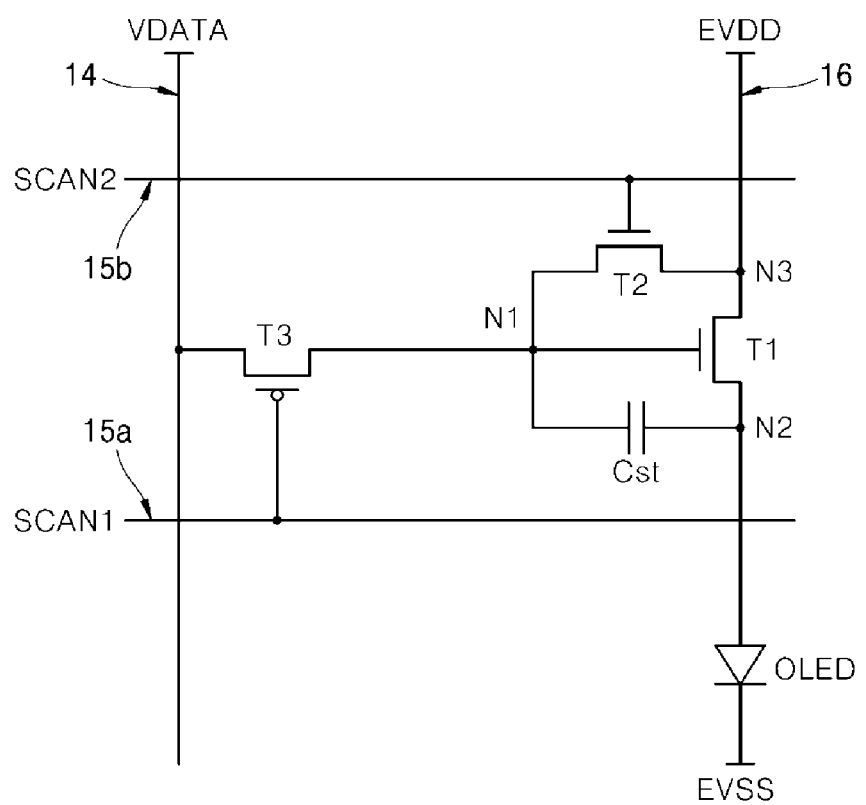
FIG. 6 is a diagram showing an equivalent circuit corresponding to one pixel in the organic light emitting display device according to a second first embodiment of the present invention.
Figure 7:
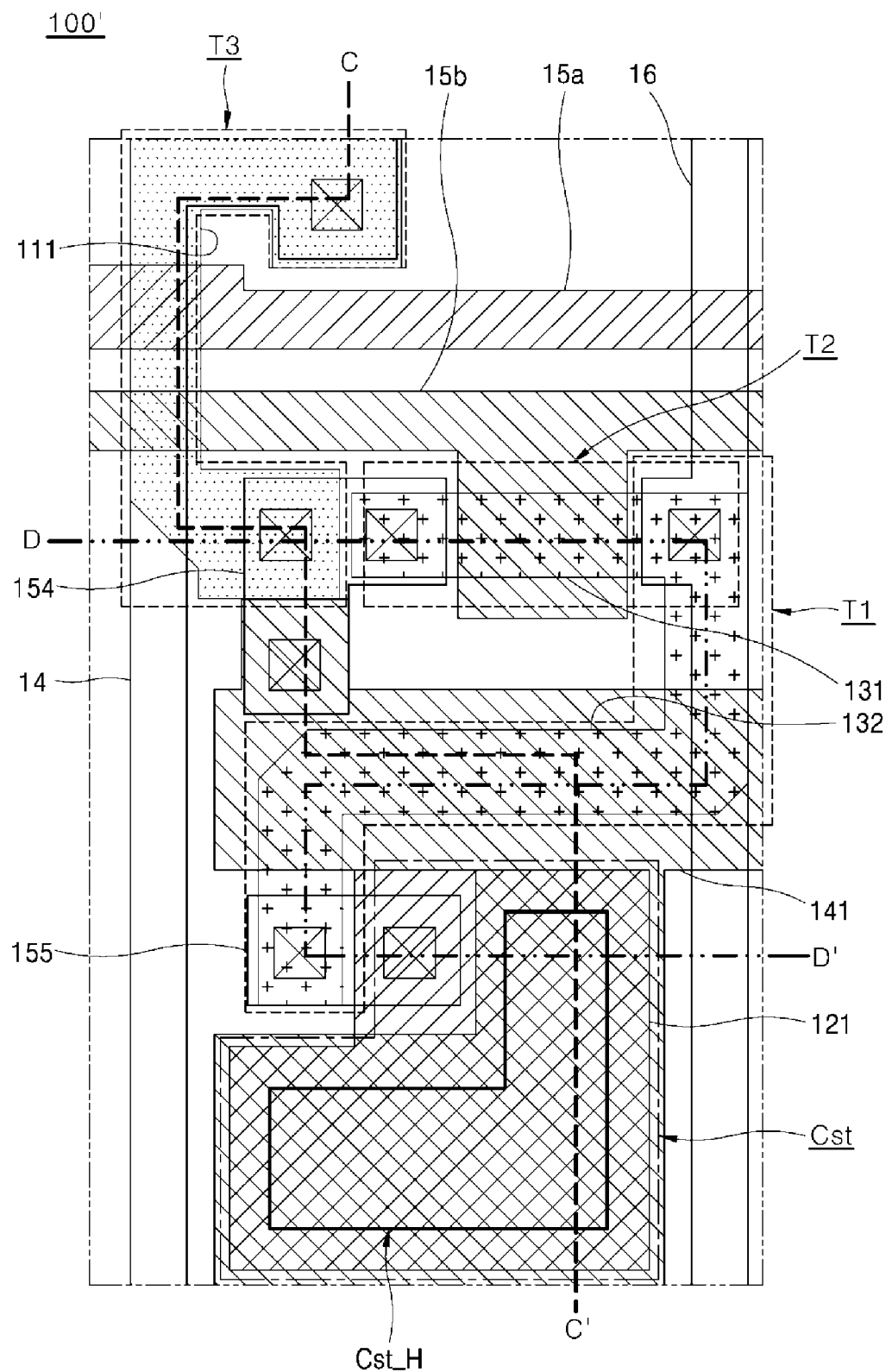
FIG. 7 is a diagram shown an example of the thin film transistor array substrate of FIG. 6 having first, second, and third thin film transistors and a capacitor.
Figure 8:
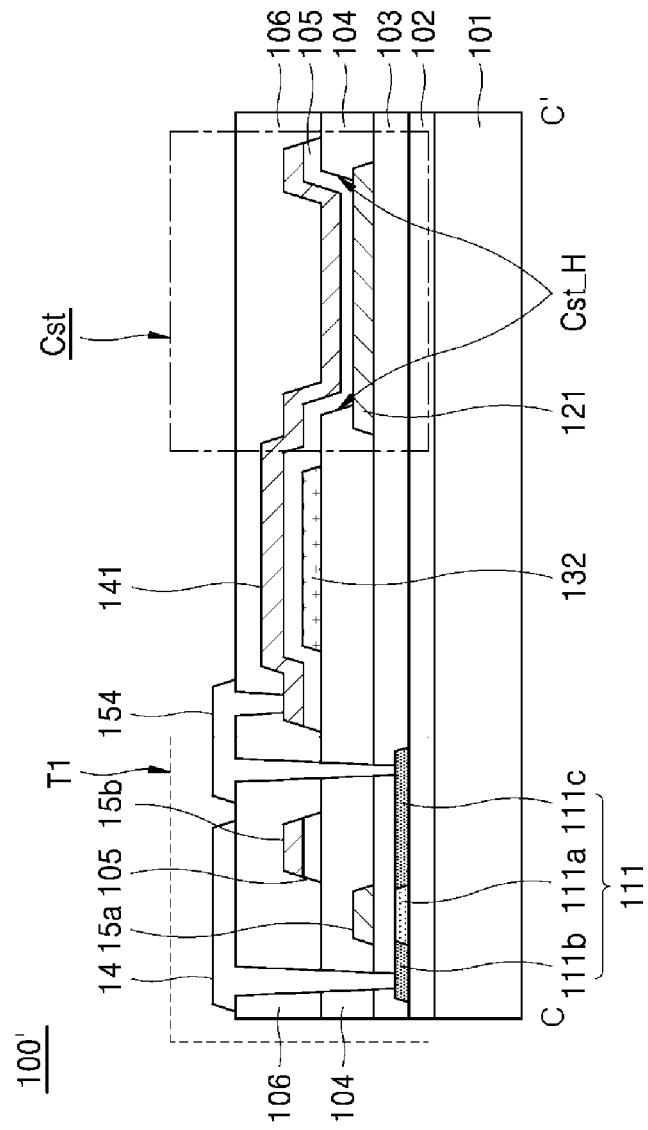
FIG. 8 is a cross-sectional view taken along a line C-C' of FIG. 7.
Figure 9:
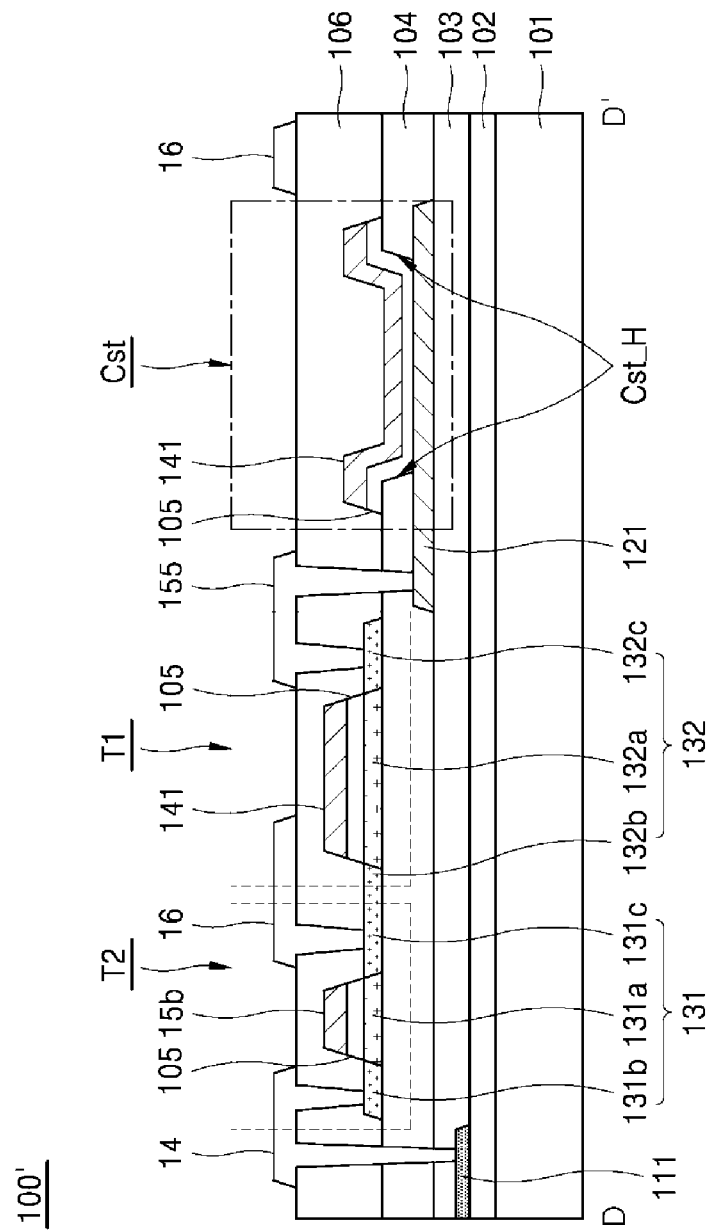
FIG. 9 is a cross-sectional view taken along a line D-D' of FIG. 7.

FIG. 6 is a diagram showing an equivalent circuit corresponding to one pixel in the organic light emitting display device according to the second first embodiment of the present invention. FIG. 7 is a diagram shown an example of the thin film transistor array substrate of FIG. 6 having first, second, and third thin film transistors and a capacitor. FIG. 8 is a cross-sectional view taken along a line C-C' of FIG. 7. FIG. 9 is a cross-sectional view taken along a line D-D' of FIG. 7.

As shown in FIG. 6, the organic light emitting display device according to the second embodiment of the present invention have the same structure (or substantially the same structure) as the first embodiment shown in FIG. 2 except that the capacitor Cst corresponding to respective pixels PXL is connected between the first and second nodes N1, N2, and that the second thin film transistor T2 is connected between the third node N3, between the first source line 16 and the first thin film transistor T1, and the first node N1. Therefore, duplicate explanation will be omitted or will be brief in the following.

More particularly, according to the second embodiment, one of a source electrode and a drain electrode of the first thin film transistor T1 is connected with the first source line supplying the first driving source EVDD while the other one is connected with an anode electrode of the organic light emitting device OLED. Further, a cathode electrode of the organic light emitting device OLED is connected with a second source line supplying a second driving source EVSS.

The capacitor Cst is connected between one of the source electrode and the drain electrode of the first thin film transistor T1, which is connected with the organic light emitting device OLED, and the gate electrode of the first thin film transistor T1. For example, one of the first and second capacitor electrodes of the capacitor Cst is connected with the first node N1 between the gate electrode of the first thin film transistor T1 and the third thin film transistor T3, while the other one is connected with the second node N2 between the first thin film transistor T1 and the organic light emitting device OLED.

The second thin film transistor T2 is connected between the other of the source electrode and the drain electrode of the first thin film transistor T1 which is connected with the first source line 16 and the gate electrode of the first thin film transistor T1. Further, the gate electrode of the second thin film transistor T2 is connected with the second scan line 15b supplying the second scan signal SCAN2.

That is, one of the source electrode and the drain electrode of the second thin film transistor T2 is connected with the third node N3 between the gate electrode of the first thin film transistor T1 and the first source line 16, while the other one is connected with the first node N1. When the second thin film transistor T2 is turned on based on the second scan signal SCAN2, it connects the first node N1 with the third node N3.

The third thin film transistor T3 is connected between the data line 14 supplying the data signal VDATA and the first node N1. That is, one of the source electrode and the drain electrode of the third thin film transistor T3 is connected with the data line 14 supplying the data signal VDATA, while the other one is connected with the first node N1.

Further, the gate electrode of the third thin film transistor T3 is connected with the first scan line 15a supplying the first scan signal SCAN1. When the third thin film transistor T3 is turned on based on the first scan signal SCAN1, it provides the data signal VDATA to the first node N1.

As shown in FIG. 7, a thin film transistor array substrate 100' according to the second embodiment of the present invention includes first, second and third thin film transistors T1, T2, T3 and a capacitor Cst disposed in the respective pixel areas. More specifically, it is different from the first embodiment in FIG. 3 in that the active layer 132 of the first thin film transistor T1 according to the second embodiment is disposed on the same layer as the active layer 131 of the second thin film transistor T2.

Further, the thin film transistor array substrate 100' can further include first and second scan lines 15a, 15b in a first direction (e.g., left-right direction in FIG. 7), and a data line 14 and a first source line 16 in a second direction (e.g., up-down direction in FIG. 7).

Further, the thin film transistor array substrate 100' can further include a fourth connecting pattern 154 connecting the second and third thin film transistors T2, T3 with the capacitor Cst and a fifth connecting pattern 155 connecting the first thin film transistor T1 with the capacitor Cst.

Both ends of the active layer 132 of the first thin film transistor T1 are connected with the first source line 16 and the capacitor Cst, respectively.

Both ends of the active layer 131 of the second thin film transistor T2 are connected with the first source line 16 and the data line 14, respectively. The gate electrode of the second thin film transistor T2 is made by a portion of the second scan line 15b which overlaps with a portion of the active layer 131 of the second thin film transistor T2.

Both ends of the active layer 111 of the third thin film transistor T1 are connected with the data line 14 and the second thin film transistor T2, respectively. The gate electrode of the third thin film transistor T3 is made by a portion of the first scan line 15a which overlaps with a portion of the active layer 111 of the third thin film transistor T3.

The capacitor Cst includes first and second capacitor electrodes 121, 141 which overlap with each other.

The first capacitor electrode 121 is connected with the second node (N2 in FIG. 6) between the first thin film transistor T1 and the organic light emitting device OLED through a fifth connecting pattern 155.

The second capacitor electrode 141 is connected with the first node (N1 in FIG. 6) between the gate electrode of the first thin film transistor T1, the second thin film transistor T2, and the third thin film transistor T3 through a fourth connecting pattern 154. A portion of the second capacitor electrode 141, which overlaps with a portion of the active layer 132 of the first thin film transistor T1, serves as the gate electrode of the first thin film transistor T1.

A capacitor hole Cst_H is disposed in a portion of an area where the first and second capacitor electrodes 121, 141 overlap with each other.

As shown in FIG. 8, the thin film transistor array substrate 100' includes a buffer film 102 covering a surface of a substrate 101, an active layer 111 of a third thin film transistor T3 disposed on the buffer film 102, a first gate insulation film 103 covering the active layer 111 of the third thin film transistor T3, a gate electrode 15a of the third thin film transistor T3 disposed on the first gate insulation film 103, a first capacitor electrode 121 of a capacitor Cst disposed on the first gate insulation film 103 and spaced apart from the gate electrode 15a of the third thin film transistor T3, a second gate insulation film 104 covering a gate electrode 15a of the third thin film transistor T3 and the first capacitor electrode 121 of the capacitor Cst, a capacitor hole Cst_H which corresponds to a portion of the first capacitor electrode 121 and penetrates the second gate insulation film 104, and a second capacitor electrode 142 of the capacitor Cst disposed on the intermediate insulation film 105 and overlaps with the first capacitor electrode 121.

As shown in FIG. 9, the thin film transistor array substrate 100' further includes an active layer 131 of the second thin film transistor T2 and an active layer 132 of the first thin film transistor T1 disposed on the second gate insulation film 104, a gate electrode 15b of the second thin film transistor T2 disposed on the intermediate insulation film 105 covering a portion of the active layer 131 of the second thin film transistor T2, and a gate electrode 141 of the first thin film transistor T1 disposed on the intermediate insulation film 105 covering a portion of the active layer 132 of the first thin film transistor T1.

As shown in FIG. 8 and FIG. 9, the thin film transistor array substrate 100' further includes an interlayer insulation film 106 covering the active layer 131 and the gate electrode 15b of the second thin film transistor T2 and the second capacitor electrode 142 of the capacitor Cst, the data line 14 and the first source line 16 disposed on the interlayer insulation film 106, and the fourth and fifth connecting patterns 154, 155.

As shown in FIG. 8 and FIG. 9, the second and third thin film transistors T2, T3 according to the second embodiment 100' have the same structure (or substantially the same structure) as those of the first embodiment 100 shown in FIG. 4. Therefore, duplicate explanation will be omitted or will be brief in the following.

According to the second embodiment 100', the capacitor Cst is disposed on the first gate insulation film 102 and includes a first capacitor electrode 121 which is spaced apart from the first scan line 15a and a second capacitor electrode 141 disposed at least on the intermediate insulation film 105 and overlapped with the first capacitor electrode 121. Further, the capacitor Cst according to the second embodiment of the present invention includes a capacitor hole Cst_H which corresponds to a portion of the overlapped area between the first and second capacitor electrodes 121, 141 and penetrates the second gate insulation film 104.

As shown in FIG. 9, the first capacitor electrode 121 is connected with the second node (N2 in FIG. 6) between the first thin film transistor T1 and the organic light emitting device OLED through the fifth connecting pattern 155 disposed on the interlayer insulation film 106.

As shown in FIG. 8, a portion of the second capacitor electrode 141 serves as the gate electrode of the first thin film transistor T1. And, as shown in FIG. 7 and FIG. 8, the second capacitor electrode 141 is connected with the first node N1 between the second and third thin film transistors T2, T3 via the fourth connecting pattern 154 disposed on the interlayer insulation film 106.

As in the case for the first embodiment 100, the capacitor Cst according to the second embodiment 100' includes a capacitor hole Cst_H which corresponds to a portion of the overlapped area between the first and second capacitor electrodes 121, 141 and penetrates the second gate insulation film 104. Therefore, the capacitance of the capacitor can be increased even in a limited area.

As shown in FIG. 9, according to the second embodiment 100', as for the case of the second thin film transistor T2, the first thin film transistor T1 includes an active layer 132 disposed on the second gate insulation film 104 covering the gate electrode 15a of the third thin film transistor T3 and the first capacitor electrode 121 of and the capacitor Cst, and a gate electrode 141 disposed on an intermediate insulation film 105 covering a portion of the active layer 132 and is made by a portion of a second capacitor electrode 141 overlapped with a portion of the active layer 132.

In the similar manner to the active layer 131 of the second thin film transistor T2, the active layer 132 of the first thin film transistor T1 can be made of an oxide semiconductor material. Further, the active layer 132 includes a channel area 132a, which overlaps with the gate electrode 141, as well as a source area 132b and a drain area 132c which are disposed at both sides of the channel area 132a. The source electrode and the drain electrode of the first thin film transistor T1 correspond to the source area 132b and the drain area 132c of the active layer 132, respectively. For example, the source area 132b and the drain area 132c of the active layer 132 can be areas which are processed to conduct more electricity than the channel area 132a.

One of the source electrode 132b and the drain electrode 132c of the first thin film transistor T1 (e.g., source electrode 132b in FIG. 9) can be connected with the first source line 16 disposed on the interlayer insulation film 106, while the other capacitor electrode 141 (e.g., drain electrode 132c in FIG. 9) can be connected with the first capacitor electrode 121 of the capacitor Cst and the organic light emitting device (OLED in FIG. 6) through the fifth connecting pattern 155 disposed on the interlayer insulation film 106.

As explained in the above, according to the second embodiment of the present invention, the first thin film transistor T1, which supplies the drive current to the organic light emitting device OLED, is formed in a structure including the active layer 132 made of an oxide semiconductor material. Therefore, a slope of a current-voltage characteristic plot of the first thin film transistor T1 can be decreased, which results in an easy control on grayscale of respective pixel PXL.

In the following, a method of manufacturing a thin film transistor array substrate according to the second embodiment of the present invention will be explained by referring to FIGS. 10-20.

FIGS. 10-20 are diagrams showing steps of a method of manufacturing the thin film transistor array substrate according to the second embodiment of the present invention.

Figure 10:
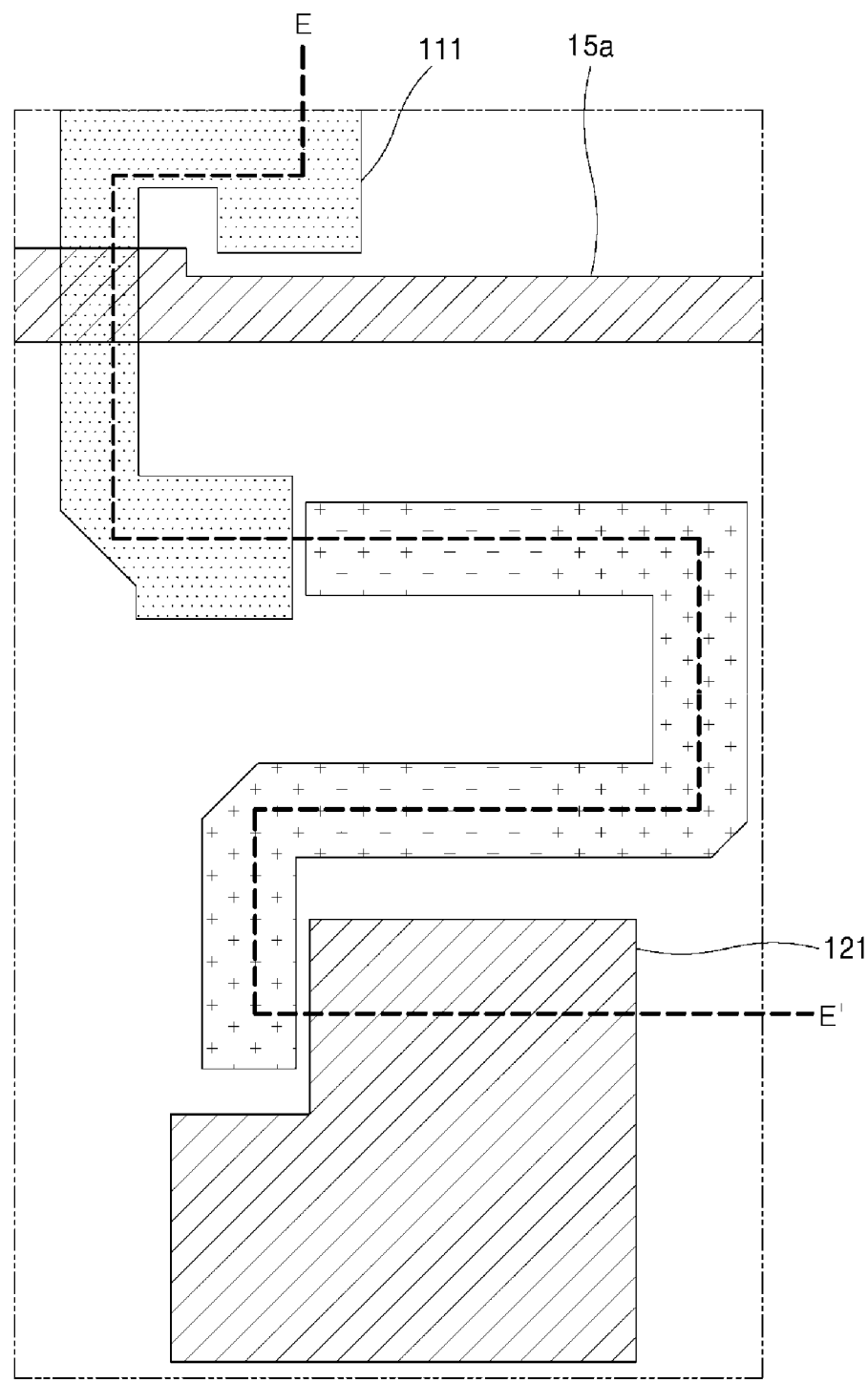
FIGS. 10-20 are diagrams showing steps of a method of manufacturing the thin film transistor array substrate according to the second embodiment of the present invention.
Figure 11:
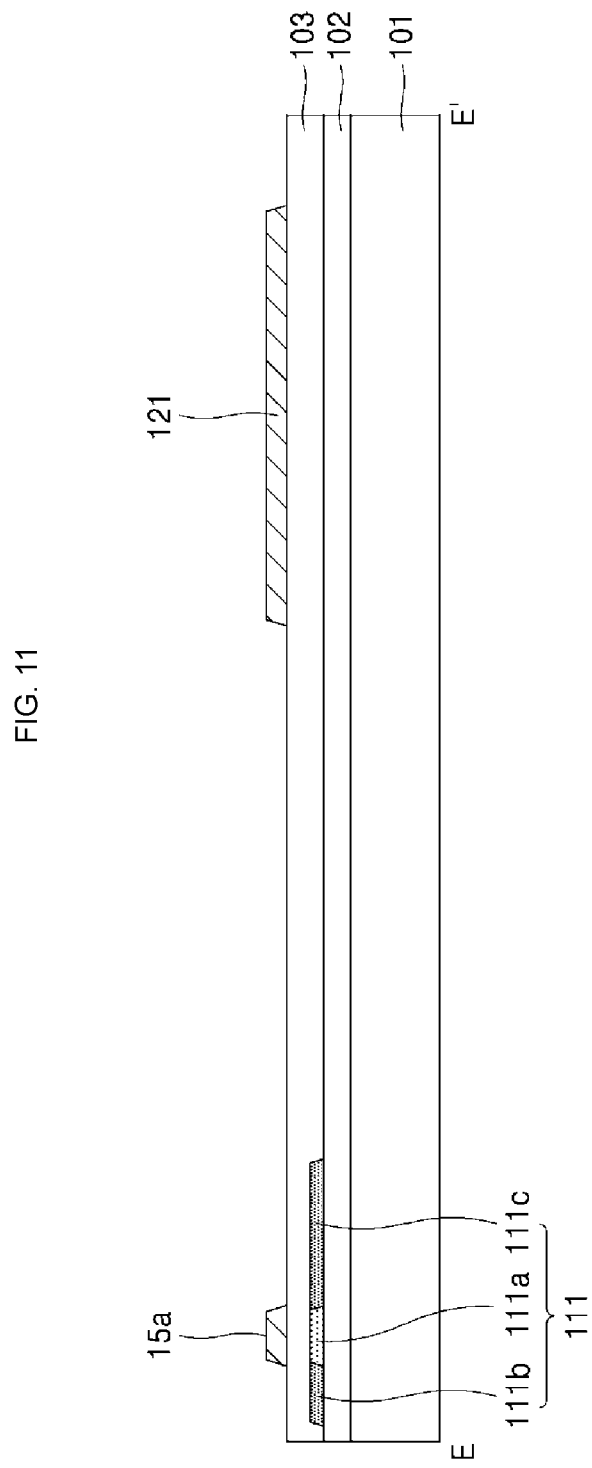

As shown in FIG. 10 and FIG. 11 (showing a cross-sectional view taken along a line E-E' of FIG. 10), a buffer film 102 is disposed on one surface of the substrate 101. Then, an active layer 111 of a third thin film transistor is disposed on the buffer film 102, and a first gate insulation film 103 is disposed to cover the active layer of 111 the third thin film transistor.

Subsequently, a first scan line 15a and a first capacitor electrode 121 are disposed on the first gate insulation film 103. Here, a portion of the first scan line 15a which overlaps with the active layer 111 of the third thin film transistor serves as a gate electrode of a third thin film transistor (15a in FIG. 11).

Then, a dopant injecting process is performed on the active layer 111 of the third thin film transistor while using the gate electrode of the third thin film transistor (15a in FIG. 11) as a mask. As a result, the active layer 111 of the third thin film transistor has a structure including a channel area 111a, which overlaps with the gate electrode 15a, and a source area 111b and a drain area 111c disposed at both sides of the channel area 111a.

Figure 12:
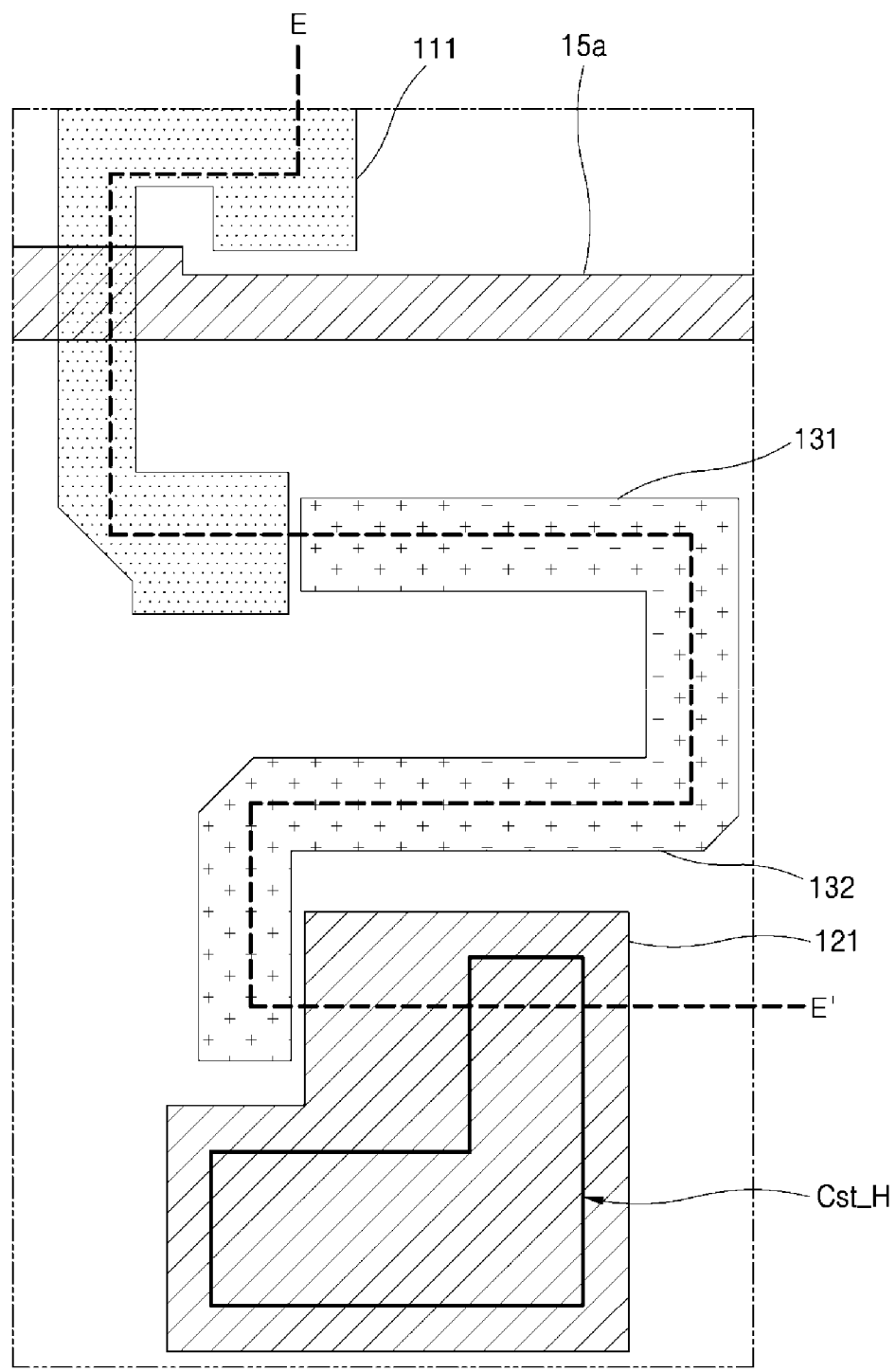
Figure 13:
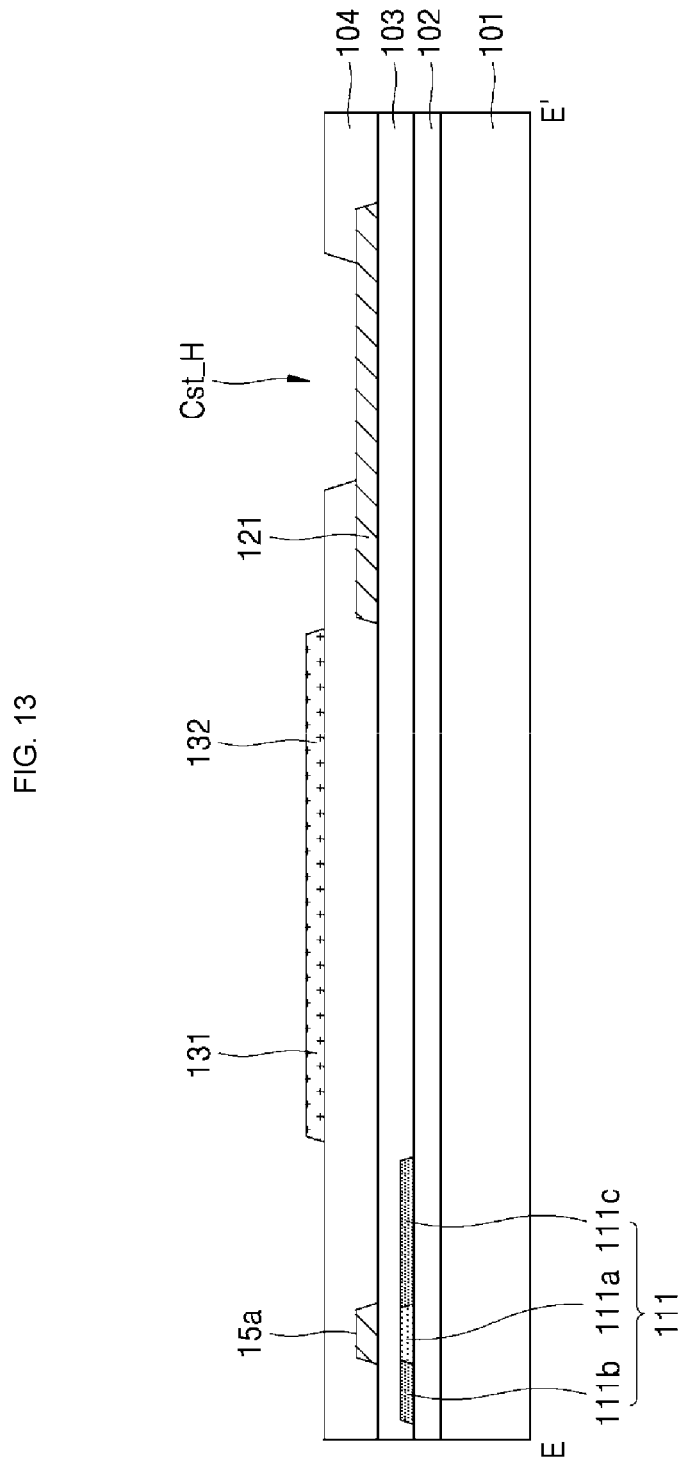

As shown in FIG. 12 and FIG. 13 (showing a cross-sectional view taken along a line E-E' of FIG. 12), a second gate insulation film 104 is disposed to cover the gate electrode 15a of the third thin film transistor and the first capacitor electrode 121. Then, a capacitor hole Cst_H is disposed to penetrate the second gate insulation film 104 to expose a portion of the first capacitor electrode 121.

Subsequently, an active layer 131 of the second thin film transistor and an active layer 132 of first thin film transistor are disposed on the second gate insulation film 104.

Next, an insulation film and a conductive layer, which are sequentially laminated on the active layer 131 of the second thin film transistor and the active layer 132 of the first thin film transistor, are patterned as a whole.

Figure 14:
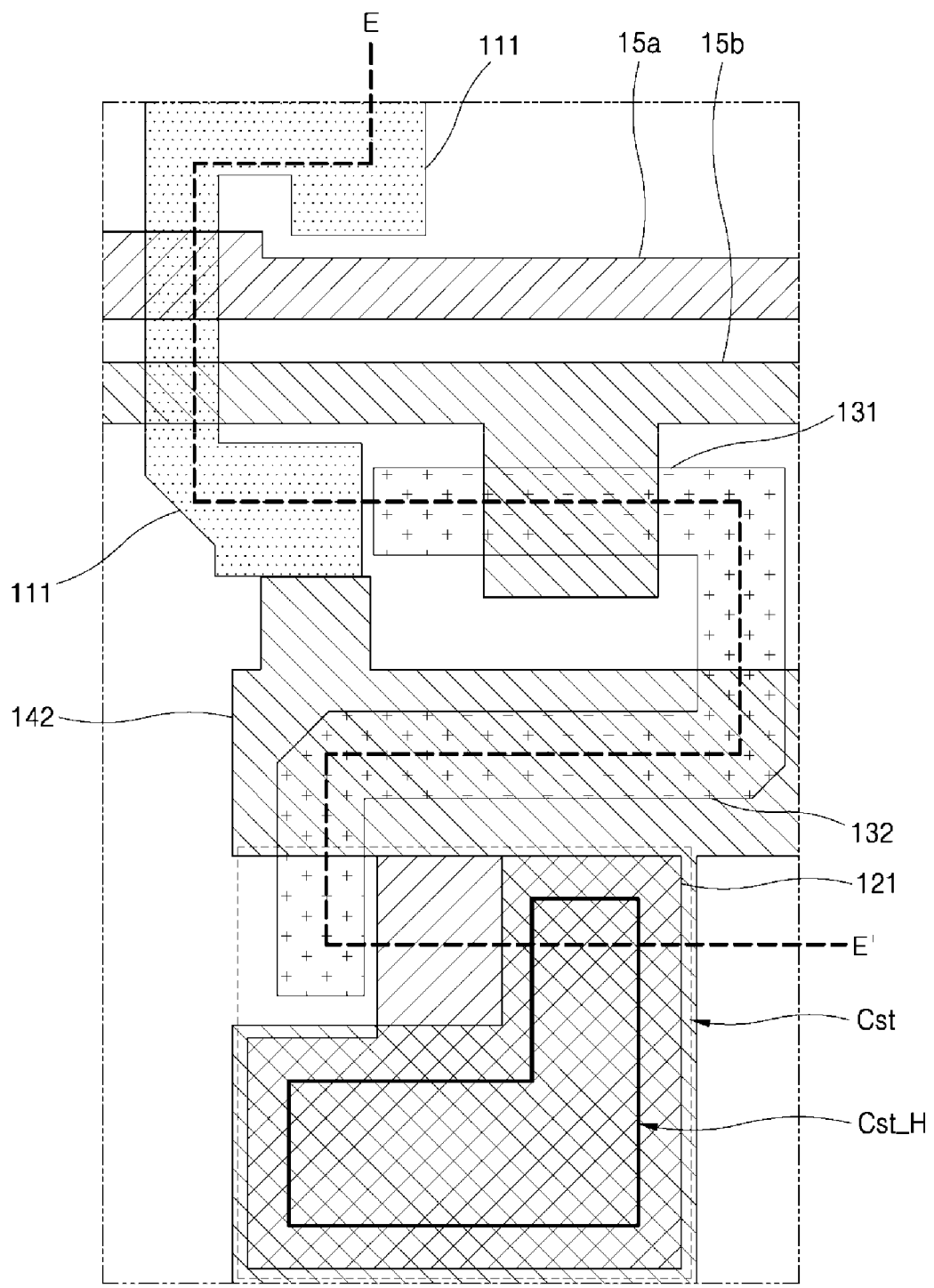
Figure 15:
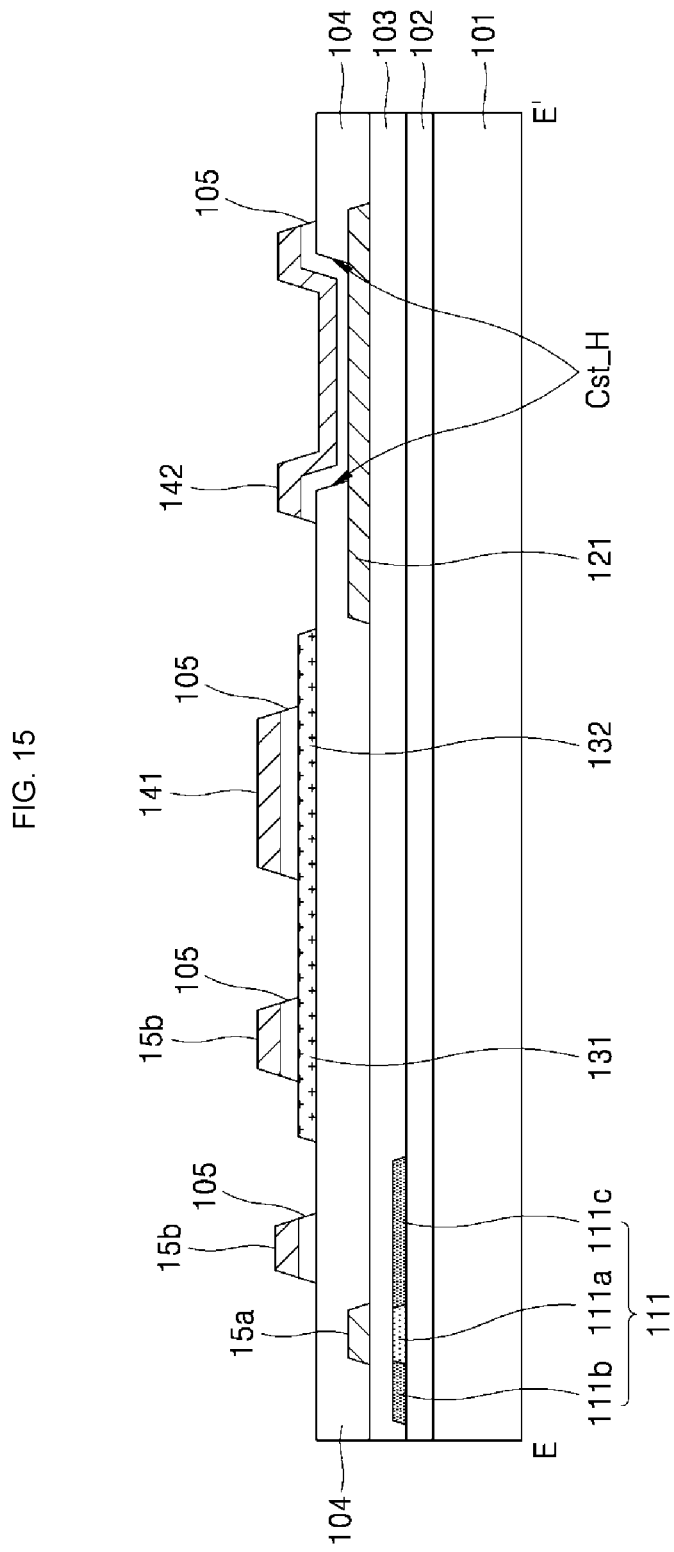

By doing so, as shown in FIG. 14 and FIG. 15 (showing a cross-sectional view taken along a line E-E' of FIG. 14), an intermediate insulation film 105 as well as and a second scan line 15b and a second storage electrode 141, which are disposed on the intermediate insulation film, are provided.

Here, a portion of the second scan line 15a which overlaps with the active layer 131 of the second thin film transistor serves as a gate electrode of the second thin film transistor (15b in FIG. 15).

Here, a portion of the second storage electrode 141 which overlaps with the active layer 132 of the first thin film transistor serves as a gate electrode of the first thin film transistor (141 in FIG. 15).

For example, as shown in FIG. 15, an intermediate insulation film 105 covering a portion of the active layer 131 of the second thin film transistor as well as a gate electrode of the second thin film transistor (15b in FIG. 15) disposed on the interlayer insulation film, and an intermediate insulation film 105 covering a portion of the active layer 131 of the first thin film transistor as well as a gate electrode of the first thin film transistor (141 in FIG. 15) disposed on the interlayer insulation film are provided.

Figure 16:
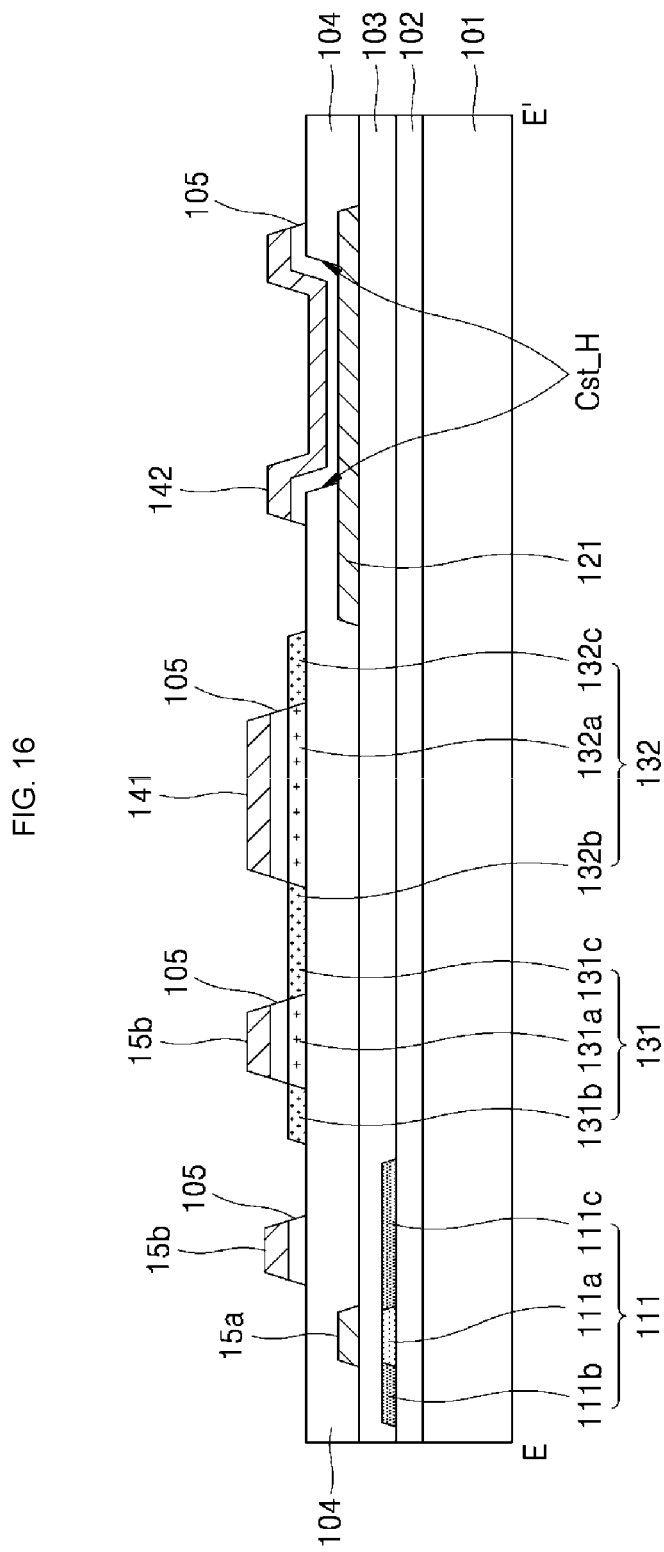

Thereafter, as shown in FIG. 16 (showing a cross-sectional view taken along a line E-E' of FIG. 15), a conduction process is performed on the active layers 132, 131 of the first and second thin film transistors while using the gate electrodes 141, 15b of the first and second thin film transistors as a mask. As a result, the active layer 132 of the first thin film transistor has a structure including a channel area 132a, which overlaps with the gate electrode 141, and a source area 132b and a drain area 132c disposed at both sides of the channel area 132a. In addition, the active layer 131 of the second thin film transistor has a structure including a channel area 131a, which overlaps with the gate electrode 15b, and a source area 131b and a drain area 131c disposed at both sides of the channel area 131a.

Figure 17:
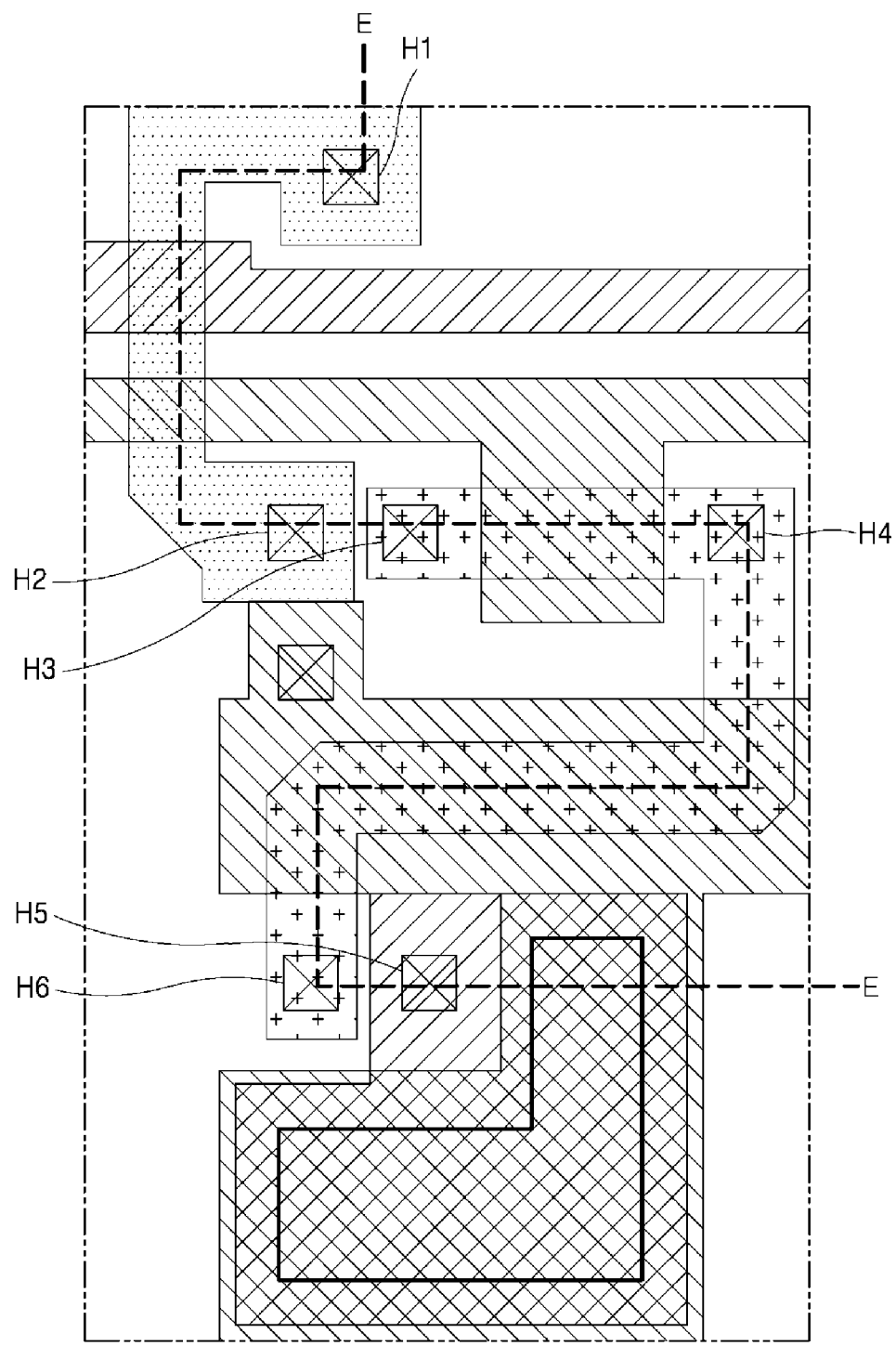
Figure 18:
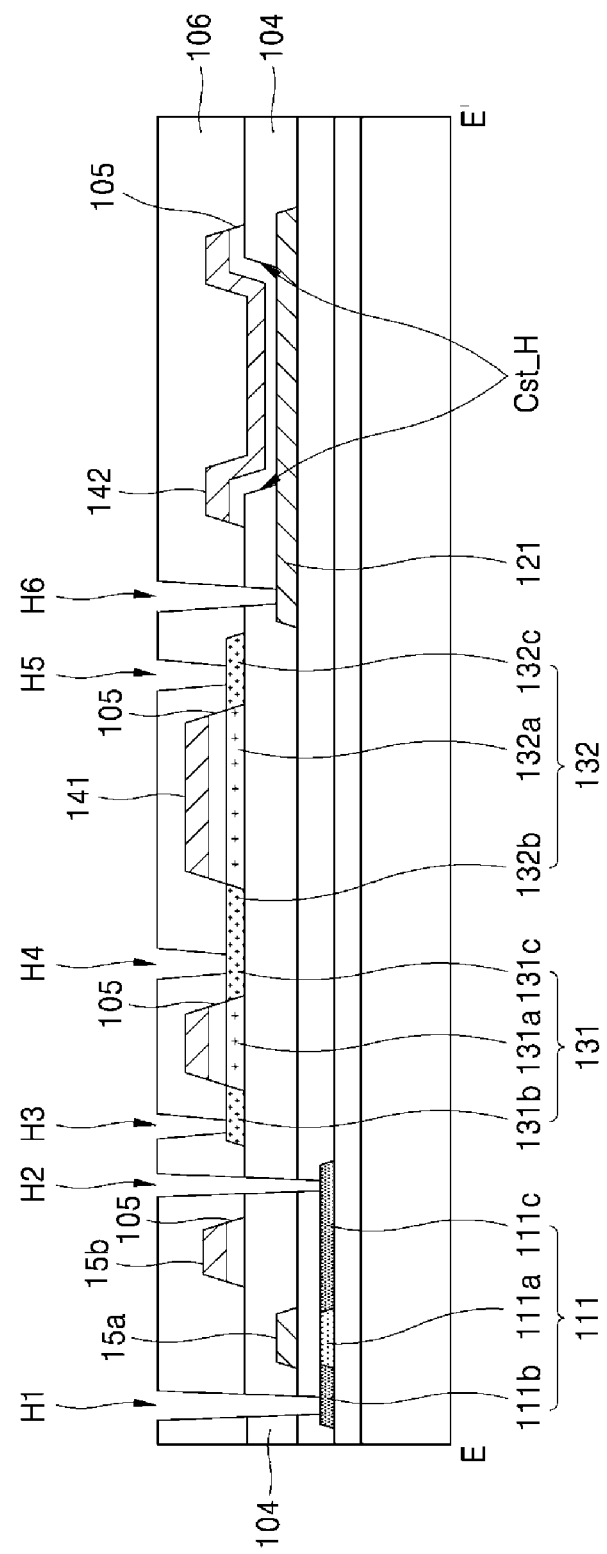

As shown in FIG. 17 and FIG. 18 (showing a cross-sectional view taken along a line E-E' of FIG. 17), an interlayer insulation film 106 is provided to cover the gate electrodes 141, 15b of the first and second thin film transistors, and patterning is then performed on at least one insulation film of the interlayer insulation film 106 and the first and second gate insulation films 103, 104 which at least includes the interlayer insulation film 106.

As a result, a plurality of contact holes H1, H2, H3, H4, H5, H6 are disposed to correspond to the source area and the drain area of the active layers of the first, second, and third thin film transistors.

Figure 19:
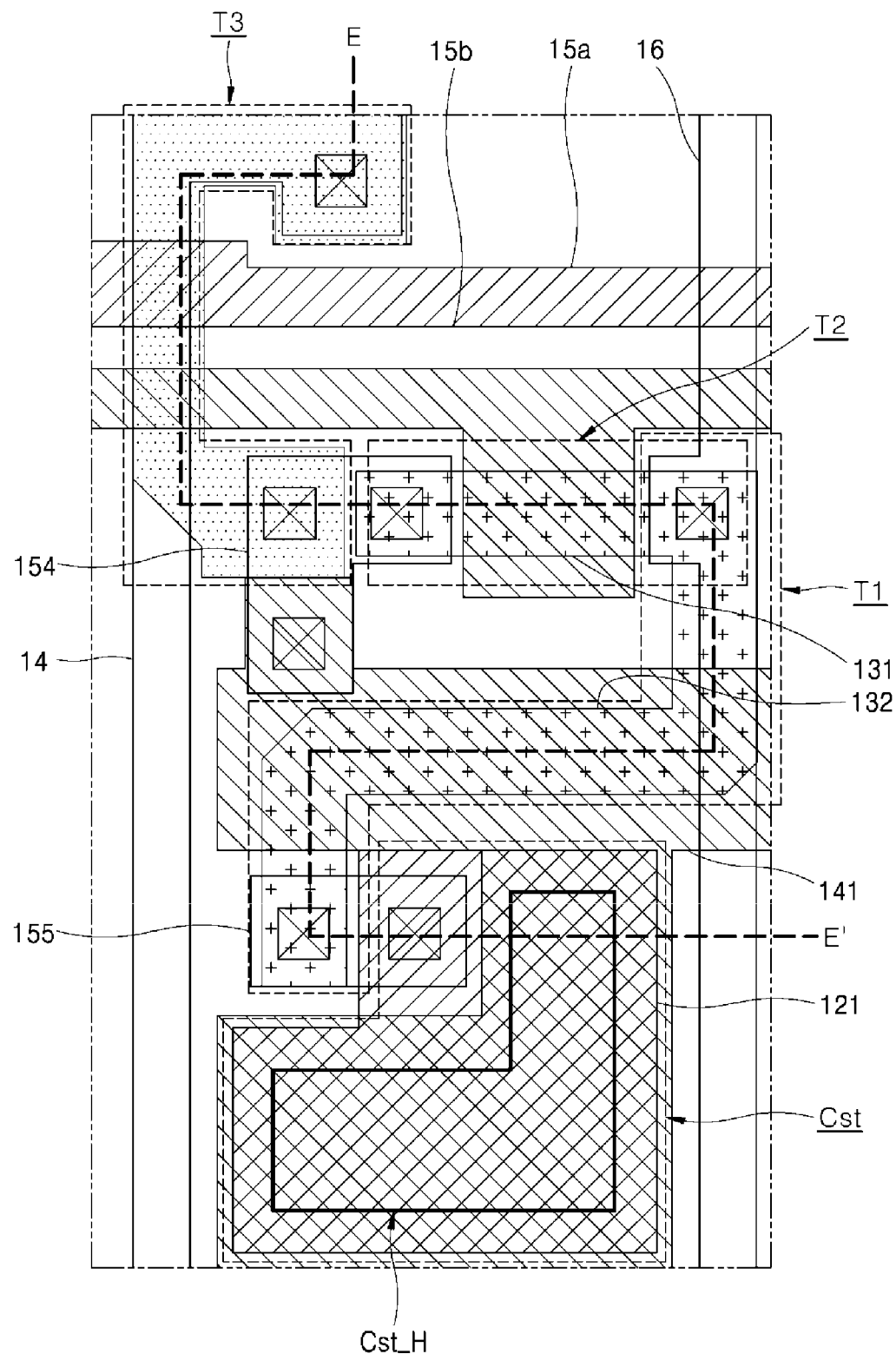
Figure 20:
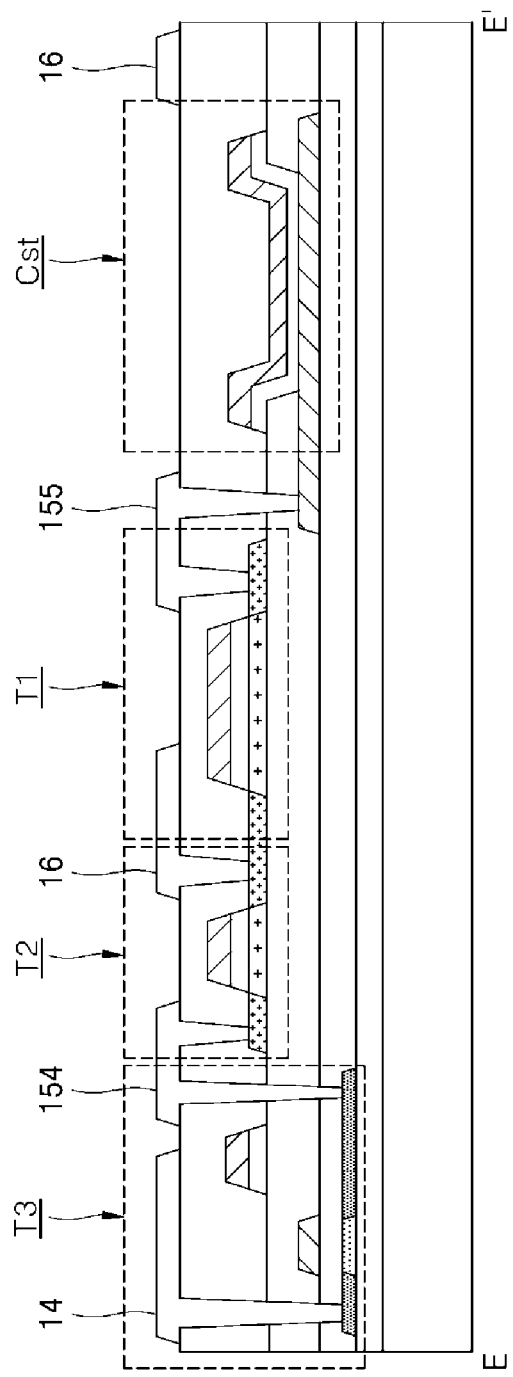

As shown in FIG. 19 and FIG. 20 (showing a cross-sectional view taken along a line E-E' of FIG. 19), a data line 14, a first source line 16, and fourth and fifth connecting patterns 154, 155 are disposed on the interlayer insulation film 106.

Accordingly, the embodiments of the present invention provide a thin film transistor array substrate and an organic light emitting display device having the same, which are capable of preventing characteristics of elements corresponding to the respective pixel areas from being degraded due to the decreased size.

The present invention as explained in the above is not limited to the described embodiments and appended figures, and it will be apparent to the ordinary person in the related art that various substitutions, modification, and variations can be made without departing from the technical spirit of the present invention.

What is claimed is:

1. A thin film transistor array substrate having a first thin film transistor, a second thin film transistor and a capacitor which are connected with a gate electrode of the first thin film transistor, and a third thin film transistor connected with the capacitor, wherein the thin film transistor array substrate comprises:
   a first gate insulation film on an active layer of the third thin film transistor;
   a gate electrode of the third thin film transistor disposed on the first gate insulation film and overlapped with a portion of the active layer of the third thin film transistor;
   a first capacitor electrode disposed on the first gate insulation film and spaced apart from the gate electrode of the third thin film transistor;
   a second gate insulation film disposed on the first gate insulation film, the gate electrode of the third thin film transistor and the first capacitor electrode;
   an active layer of the second thin film transistor disposed on the second gate insulation film;
   a gate electrode of the second thin film transistor overlapped with a portion of the active layer of the second thin film transistor;
   a second capacitor electrode of the capacitor disposed on the second gate insulation film and overlapped with the first capacitor electrode; and
   an intermediate insulation film disposed below each of the gate electrode of the second thin film transistor and the second capacitor electrode,
   wherein the capacitor corresponds to an overlap area where the first and second capacitor electrodes overlap with each other.

2. The thin film transistor array substrate of claim 1, further comprising:
   a capacitor hole which corresponds to a portion of the overlap area and penetrates the second gate insulation film,
   wherein in the portion of the overlap area corresponding to the capacitor hole, only the intermediate insulation film is disposed between the first and second capacitor electrodes, and in the other portion of the overlap area, both the intermediate insulation film and the second gate insulation film are disposed between the first and second capacitor electrodes.

3. The thin film transistor array substrate of claim 1, wherein one of the first and second capacitor electrodes is connected with the gate electrode of the first thin film transistor.

4. The thin film transistor array substrate of claim 3, wherein an active layer of the first thin film transistor is disposed on the same layer as the active layer of the third thin film transistor, and the gate electrode of the first thin film transistor is disposed on the first gate insulation film and is connected with the first capacitor electrode.

5. The thin film transistor array substrate of claim 3, wherein an active layer of the first thin film transistor is disposed on the second gate insulation film, and the gate electrode of the first thin film transistor is overlapped with a portion of active layer of the first thin film transistor and is connected with the second capacitor electrode, and
   wherein the intermediate insulation film is further disposed below the gate electrode of the first thin film transistor.

6. The thin film transistor array substrate of claim 1, wherein the active layer of the third thin film transistor is made of a polysilicon semiconductor material, and the active layer of the second thin film transistor is made of an oxide semiconductor material.

7. A thin film transistor array substrate having a first thin film transistor, a second thin film transistor and a capacitor which are connected with a gate electrode of the first thin film transistor, and a third thin film transistor connected with the capacitor, wherein the thin film transistor array substrate comprises:
   a first capacitor electrode disposed on a first gate insulation film covering an active layer of the third thin film transistor;
   an active layer of the second thin film transistor disposed on a second gate insulation film covering the first capacitor electrode;
   a gate electrode of the second thin film transistor disposed on an intermediate insulation film covering a portion of the active layer of the second thin film transistor; and
   a second capacitor electrode of the capacitor disposed on the intermediate insulation film and overlapped with the first capacitor electrode,
   wherein an active layer of the first thin film transistor is disposed on the same layer as the active layer of the third thin film transistor, and the gate electrode of the first thin film transistor is disposed on the first gate insulation film and is connected with the first capacitor electrode.

8. An organic light emitting display device having organic light emitting devices corresponding to respective pixel areas, a first thin film transistor supplying a drive current to the organic light emitting device, a second thin film transistor connected between a gate electrode of the first thin film transistor and the organic light emitting device, a capacitor connected between the gate electrode of the first thin film transistor and a third thin film transistor, the organic light emitting display device comprising:
   an active layer of the third thin film transistor disposed on a substrate;
   a first gate insulation film disposed on the substrate and the active layer of the third thin film transistor;
   a gate electrode of the third thin film transistor disposed on the first gate insulation film and overlapped with a portion of the active layer of the third thin film transistor;
   a first capacitor electrode of the capacitor disposed on the first gate insulation film and is spaced apart from the gate electrode of the third thin film transistor;
   a second gate insulation film disposed on the first gate insulation film, the gate electrode of the third thin film transistor and the first capacitor electrode of the capacitor;
   an active layer of the second thin film transistor disposed on the second gate insulation film;
   a gate electrode of the second thin film transistor overlapped with a portion of the active layer of the second thin film transistor;
   a second capacitor electrode of the capacitor disposed on the second gate insulation film and overlapped with the first capacitor electrode; and an intermediate insulation film disposed below each of the gate electrode of the second thin film transistor and the second capacitor electrode, wherein the capacitor corresponds to an overlap area where the first and second capacitor electrodes overlap with each other.

9. The organic light emitting display device of claim 8, further comprising a capacitor hole which corresponds to a portion of the overlap area and penetrates the second gate insulation film, wherein in the portion of the overlap area corresponding to the capacitor hole, only the intermediate insulation film is disposed between the first and second capacitor electrodes, and in the other portion of the overlap area, both the intermediate insulation film and the second gate insulation film are disposed between the first and second capacitor electrodes.

10. The organic light emitting display device of claim 8, wherein an active layer of the first thin film transistor is disposed on the same layer as the active layer of the third thin film transistor, and the gate electrode of the first thin film transistor is disposed on the first gate insulation film and is connected with the first capacitor electrode.

11. The organic light emitting display device of claim 10, wherein one of a source electrode and a drain electrode of the first thin film transistor is connected with a first source line while the other one of the source electrode and the drain electrode of the first thin film transistor is connected with the organic light emitting device, wherein one of a source electrode and a drain electrode of the second thin film transistor is connected with a first node between the capacitor and the gate electrode of the first thin film transistor while the other of the source electrode and the drain electrode of the second thin film transistor is connected with a second node between the first thin film transistor and the organic light emitting device, wherein one of a source electrode and a drain electrode of the third thin film transistor is connected with a data line while the other one of the source electrode and the drain electrode of the third thin film transistor is connected with the second capacitor electrode of the capacitor, and wherein an anode electrode of the organic light emitting device is connected with the second node while a cathode electrode of the organic light emitting device is connected with a second source line.

12. The organic light emitting display device of claim 8, wherein an active layer of the first thin film transistor is disposed on the second gate insulation film, and the gate electrode of the first thin film transistor is overlapped with a portion of active layer of the first thin film transistor and is connected with the second capacitor electrode, and wherein the intermediate insulation film is further disposed below the gate electrode of the first thin film transistor.

13. The organic light emitting display device of claim 12, wherein one of a source electrode and a drain electrode of the first thin film transistor is connected with a first source line while the other one of the source electrode and the drain electrode of the first thin film transistor is connected with the organic light emitting device, wherein the first capacitor electrode of the capacitor is connected with a first node between the gate electrode of the first thin film transistor and the third thin film transistor, while the second capacitor electrode of the capacitor is connected with a second node between the first thin film transistor and the organic light emitting device, wherein one of one of a source electrode and a drain electrode of the second thin film transistor is connected with the first node while the other one of the source electrode and the drain electrode of the second thin film transistor is connected with a third node between the first source line and the first thin film transistor, wherein one of a source electrode and a drain electrode of the third thin film transistor is connected with a data line while the other one of the source electrode and the drain electrode of the third thin film transistor is connected with the first node, and wherein an anode electrode of the organic light emitting device is connected with the second node while a cathode electrode of the organic light emitting device is connected with a second source line.

14. The organic light emitting display device of claim 8, further comprising:

an interlayer insulation film disposed on the second gate insulation film and covering the gate electrode of the second thin film transistor and the second capacitor electrode;

a data line disposed on the interlayer insulation film and connected with the third thin film transistor; and a first source line disposed on the interlayer insulation film and connected with the first thin film transistor.

15. The organic light emitting display device of claim 8, wherein the active layer of the third thin film transistor is made of a polysilicon semiconductor material, and the active layer of the second thin film transistor is made of an oxide semiconductor material.

* * * * *